United States Patent
Naito et al.

(10) Patent No.: US 7,397,326 B2
(45) Date of Patent: Jul. 8, 2008

(54) ELECTROMECHANICAL FILTER

(75) Inventors: Yasuyuki Naito, Suginami-ku (JP); Yoshito Nakanishi, Machida (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 297 days.

(21) Appl. No.: 10/578,040

(22) PCT Filed: Nov. 19, 2004

(86) PCT No.: PCT/JP2004/017246

§ 371 (c)(1),
(2), (4) Date: May 1, 2006

(87) PCT Pub. No.: WO2005/050839

PCT Pub. Date: Jun. 2, 2005

(65) Prior Publication Data
US 2007/0075806 A1    Apr. 5, 2007

(30) Foreign Application Priority Data
Nov. 19, 2003 (JP) .............................. 2003-389832
Nov. 2, 2004 (JP) .............................. 2004-319355

(51) Int. Cl.
*H03H 9/46* (2006.01)
(52) U.S. Cl. ........................ 333/186; 333/188
(58) Field of Classification Search ............... 333/186, 333/188
See application file for complete search history.

(56) References Cited

U.S. PATENT DOCUMENTS

| 5,836,203 | A  | * | 11/1998 | Martin et al. | .......... | 73/579 |
|---|---|---|---|---|---|---|
| 6,348,846 | B1 | * | 2/2002 | von Gutfeld et al. | ........ | 333/201 |
| 6,722,206 | B2 | * | 4/2004 | Takada | .......... | 73/779 |
| 6,819,103 | B2 | * | 11/2004 | Champion et al. | .......... | 324/260 |
| 6,947,719 | B2 | * | 9/2005 | Buchaillot et al. | .......... | 455/307 |
| 6,995,633 | B2 | * | 2/2006 | Nakamura et al. | .......... | 333/186 |
| 2003/0030527 | A1 | * | 2/2003 | Mhani et al. | ................ | 336/130 |
| 2003/0030998 | A1 | * | 2/2003 | Mhani et al. | ................ | 361/760 |
| 2007/0164839 | A1 | * | 7/2007 | Naito | .......... | 333/186 |
| 2007/0222541 | A1 | * | 9/2007 | Naito | .......... | 333/186 |

FOREIGN PATENT DOCUMENTS

| JP | 01-114111 | * | 5/1989 | ................. | 333/166 |
|---|---|---|---|---|---|
| JP | 02-052514 | * | 2/1990 | | |
| JP | 2003-309449 | * | 10/2003 | | |

OTHER PUBLICATIONS

Schloemann et al., "Epitaxial Fe films on GaAs for hybrid semiconductor-magnetic memories", Apr. 1988, pp. 3140-3142 Journal of Applied Physics vol. 63, No. 8.

* cited by examiner

*Primary Examiner*—Barbara Summons
(74) *Attorney, Agent, or Firm*—Pearne & Gordon LLP

(57) ABSTRACT

A small-size electromechanical filter that can be highly integrated and can be tuned is provided.

An electromechanical filter includes a conductor acting as a signal line (movable electrode) 101, a magnetic field generating portion 102 for generating a magnetic field passing through the conductor, and a drive electrode 103 for changing the magnetic field passing through the signal line by displacing relative positions of the conductor and the magnetic field generating portion, whereby a tuning of a ferromagnetic resonance frequency, which is difficult to realize in the prior art, can be realized by changing the magnetic field passing through the signal line.

27 Claims, 14 Drawing Sheets

ELECTROMECHANICAL FILTER

TECHNICAL FIELD

The present invention relates to an electromechanical filter and, more particularly, an electromechanical filter comprising an electrode acting as a signal line, a magnetic field generating portion, and a mechanism for moving these portions.

BACKGROUND ART

Through the spread of information communication devices such as radio terminals, an extension of the frequency band used in the communication is accelerated from several hundreds MHz for the mobile phone, or the like to the several GHz band for the radio LAN, or the like. In the existing circumstance, terminals that are adaptable for various communication systems respectively are used independently. But the radio terminal that can conform to various communication systems alone is desired in the future.

Meanwhile, with the progress of a miniaturization of the radio terminal, a size reduction of passive parts such as a filter built in an enclosure of the terminal is desired. In the filter utilizing the LC electric resonance, or the like that is often used particularly in the radio communication in recent years, a resonator size depends on an electric length. As a result, such a problem lies that a miniaturization of the filter is difficult, and thus it is tried to grope for the new principle of signal selection.

Among various approaches, the development of the GHz band element using the magnetic material is stimulated. An attempt to use the magnetic material in the passive element aiming at the high frequency band from several hundreds MHz to several GHz band or more ranges up to the filter for the high-frequency transmission line. As its advantage, it may be listed that such filter using the magnetic metal material such as Fe, or the like is excellent in the temperature characteristic and the saturation magnetization and is suitable for the integration to IC. Recently it was reported that a wavelength shortening effect can be increased by introducing the magnetic metal, and thus the expectation is running high for the miniaturization of the element rises.

As the filter using the magnetic material, there is Non-Patent Literature 1, for example. In this Non-Patent Literature 1, the Fe/GaAs substrate hybrid microstrip line in which the microstrip line made of the ferromagnetic film containing Fe is formed on the GaAs substrate is constructed, and thus the 10 GHz band band-stop filter is realized by utilizing the ferromagnetic resonance phenomenon. A ferromagnetic resonance frequency f of this band-stop filter is given by Eq. (1). Where $\gamma$ is a gyromagnetic constant ($1.105 \times 10^5$ g $[A^{-1} \cdot m \cdot s^{-1}]$, g:Land'e's factor), $H_a$ is an anisotropic magnetic field (A/m), $I_s$ is a saturation magnetic field (T), and H is a DC bias magnetic field.

The anisotropic magnetic field $H_a$ is given by Eq. (2) from the crystal magnetic anisotropy constant $K_1 \sim 48 \text{ kJ/m}^3$ and the saturation magnetization $I_s \sim 2.15$ T of the single crystal Fe film. Since $g \sim 2$ in the transition metal Fe, the ferromagnetic resonance frequency becomes about 9.85 GHz when the external DC bias magnetic field H is zero.

The ferromagnetic resonance frequency can be tuned by changing an intensity of the DC bias magnetic field H, and thus the tunable filter can be realized.

Also, the value of the ferromagnetic resonance frequency depends on not only the intensity of the DC bias magnetic field H but also the vector thereof. Eq. (1) expresses the case where the high-frequency magnetic field generated by the strip line current intersects orthogonally with the magnetic moment generated by the DC bias magnetic field. The ferromagnetic resonance does not occur when the high-frequency magnetic field and the magnetic moment are directed in the same direction. The vector of the DC bias magnetic field H must also be regarded.

Non-Patent Literature 1: E. Schloemann et al.,: J. Appl. Phys., 63,3140 (1998)

DISCLOSURE OF THE INVENTION

Problems that the Invention is to Solve

However, in the filter recited in Non-Patent Literature 1, once the materials are deposited such that the axis of easy magnetization of the magnetic material intersects orthogonally with the high-frequency magnetic field, it is impossible to vary the intensity and the direction of the DC bias magnetic field H thereafter. Thus, such a problem exists that the tunable filter cannot be realized at present. The tunable filtering effect is achieved experimentally by controlling the direction and the intensity of the magnetization of the magnetic material by means of a massive magnetic field applying equipment. Of course, such mechanism cannot be applied to the small-size device such as the mobile terminal. Also, the magnetic field applying coil flows a current through there to increase the consumption power. Thus, such mechanism is also unsuitable for the mobile terminal from this aspect. Under such circumstances, there is the problem that it is hard for the technology in Non-Patent Literature 1 to realize the tunable filter that can be applied to the mobile terminal.

The present invention has been made in view of the above circumstances, and it is an object of the present invention to provide a tunable filter that is small in size, has a small consumption power, and is capable of tuning a passing band (band-pass frequency) or a cut-off band (band-stop frequency).

That is, it is an object of the present invention to provide an electromechanical filter comprising an electrode acting as a signal line, a magnetic field generating portion, and a mechanism for moving these portions, and capable of not only selectively outputting only a signal at a predetermined frequency but also tuning a predetermined frequency.

Means for Solving the Problems

In order to achieve the above object, in the present invention, a ferromagnetic resonance frequency is tuned by vector-modulating relatively a high-frequency magnetic field generated by a current flowing through a signal line and a DC bias magnetic field intersecting with the above magnetic field. In other words, an electromechanical filter of the present invention includes an electrode acting as a signal line, a drive electrode arranged to oppose to the electrode, and a magnetic field generating portion formed to be relatively vector-displaced by an electric field generated between these electrodes, wherein either of these electrodes or the magnetic field generating portion can be moved, only the signal having a predetermined frequency out of signals passing through the signal line can be selected and output, and also the predetermined frequency can be tuned.

According to this configuration, the magnetic field generated by the magnetic field generating portion passing through the electrode constituting the signal line can be varied by displacing any one of the first and second electrodes and the magnetic field generating portion. Therefore, the tuning of the ferromagnetic resonance frequency, which is difficult to realize in the prior art, can be achieved and also the passing band or the cut-off band can be tuned only by the electric operation.

According to this configuration, a filter having a signal filtering tunable function can be realized.

In the present invention, the technology of driving the electrodes and the magnetic field generating portion to displace mechanically can be realized by a beam formed by the MEMS (Micro Electro Mechanical Systems) technology, another beam or an electrode provided to this beam, a circuit portion having an electromechanical effect, and a magnetic field generating portion.

An electromechanical filter of the present invention, includes a conductor acting as a signal line, a magnetic field generating portion for generating a magnetic field passing through the conductor, and a drive electrode for changing the magnetic field passing through the signal line by displacing relative positions of the conductor and the magnetic field generating portion.

According to this configuration, since the conductor, the drive electrode, or the magnetic field generating portion can be displaced by changing an electrostatic force by the drive electrode, or the like, the magnetic field passing through the signal line can be changed and thus the ferromagnetic resonance frequency can be easily adjusted.

Also, in the electromechanical filter of the present invention, the conductor is an electrode that is arranged to oppose to the drive electrode and is displaced by an electrostatic force generated between the drive electrode and the conductor.

According to this configuration, the signal line can be easily displaced if such signal line is constructed by a fixed beam, and the ferromagnetic resonance frequency can be easily adjusted only by adjusting the potential applied to the drive electrode, and thus the tunable electromechanical filter can be formed Also, in the electromechanical filter of the present invention, the magnetic field generating portion includes a magnetic material that is formed to be displaced.

According to this configuration, the direction of the magnetic field can be easily changed, and thus the tunable electromechanical filter can be formed. Also, if the magnetic field generating portion is movable, the signal line can be fixed, and thus the signal line having a desired thickness can be formed on the substrate surface. Therefore, the electromechanical filter that is ready to manufacture and has the high durability can be formed. Also, the reliability can be further enhanced since the signal transmission line itself can be fixed.

Also, in the electromechanical filter of the present invention, the magnetic material that is displaced by an electrostatic force of the drive electrode.

According to this configuration, the magnetic material can be displaced only by changing the potential of the drive electrode, and the change of the magnetic field can be easily realized. Therefore, the tunable electromechanical filter can be formed.

Also, in the electromechanical filter of the present invention, the drive electrode is movable.

According to this configuration, a margin of design can be increased. If the drive electrode is movable, the signal line can be fixed. The magnetic field generating portion can be further displaced by the drive electrode that is displaced by an interaction between the signal line and the drive electrode.

Also, the electromechanical filter of the present invention further includes a drive electrode formed on a substrate surface and constructed to vary a potential, a conductor pattern arranged on the drive electrode to oppose thereto at a predetermined interval to constitute the signal line, and a magnetic field generating portion comprising a magnetic material film pattern that is magnetized to have a magnetic filed component that intersects orthogonally with the signal line, wherein the signal line is displaced by changing a potential of the drive electrode, and a ferromagnetic resonance frequency is changed by changing the magnetic field generated by the magnetic material film pattern on the signal line.

According to this configuration, the signal line can be displaced easily by changing the potential of the drive electrode. As a result, the magnetic field that the signal line receives can be easily changed, and thus the tunable electromechanical filter can be formed.

Also, in the electromechanical filter of the present invention, the drive electrode is constructed by a conductor pattern formed on an insulating film that covers a semiconductor substrate surface, and the signal line constitutes a fixed beam that is arranged to oppose to the drive electrode.

According to this configuration, the workability can be improved, the magnetic field that the signal line receives can be changed easily, and thus the tunable electromechanical filter can be formed.

Also, in the electromechanical filter of the present invention, the signal line is arranged in parallel with the drive electrode, and the magnetic material film pattern forms a magnetic field in a direction that intersects orthogonally with the signal passing through the signal line.

According to this configuration, the change of the magnetic field can be picked up to the maximum as a change of the resonance frequency, and thus the tunable electromechanical filter can be formed.

Also, in the electromechanical filter of the present invention, the magnetic material film pattern includes first and second magnetic material film patterns arranged to put the signal line therebetween.

According to this configuration, the magnetic material can be displaced in two horizontal directions, and thus the tuning can be controlled with higher precision.

Also, the electromechanical filter of the present invention further includes a magnetic field generating portion formed of a magnetic material film pattern formed on a substrate surface, a conductor pattern arranged movably on the magnetic material film pattern to oppose thereto at a predetermined interval to constitute the signal line, and a drive electrode arranged in close vicinity to the signal line, wherein the magnetic material film pattern is magnetized to have a magnetic field component that intersects orthogonally with the signal line, and the signal line is displaced by changing a potential of the drive electrode, and a ferromagnetic resonance frequency is changed by changing the magnetic field generated by the magnetic material film pattern on the signal line.

According to this configuration, the fine and tunable electromechanical filter with high reliability can be formed easily by the thin film process.

Also, in the electromechanical filter of the present invention, the magnetic material film pattern is formed on an insulating film that covers a semiconductor substrate surface, and the signal line constitutes a fixed beam that is arranged to oppose to the magnetic material film pattern.

According to this configuration, the short-circuit can be prevented even though the signal line comes into contact with the semiconductor substrate because of its displacement.

Also, in the electromechanical filter of the present invention, the signal line is arranged in parallel with the drive electrode, and the magnetic material film pattern generates a magnetic field in a direction that intersects orthogonally with the signal passing through the conductor pattern.

According to this configuration, the high-sensitive tuning can be executed with high precision since the signal line intersects orthogonally with the magnetic field.

Also, in the electromechanical filter of the present invention, the drive electrode includes first and second conductor film patterns arranged to put the signal line therebetween.

According to this configuration, the tuning can be controlled with high precision since the magnetic material can be displaced in two horizontal directions.

Also the electromechanical filter of the present invention further includes a magnetic field generating portion formed of a magnetic material film pattern that is formed on a substrate surface movably in a space, a conductor pattern fixed/arranged onto the substrate to oppose to the magnetic material film pattern at a predetermined interval and to constitute the signal line, and a drive electrode arranged in close vicinity to the magnetic field generating portion to displace the magnetic field generating portion, wherein the magnetic material film pattern is magnetized to have a magnetic field component that intersects orthogonally with the signal line, the signal line is displaced by changing a potential of the drive electrode, and a ferromagnetic resonance frequency is changed by changing the magnetic field generated by the magnetic material film pattern on the signal line.

According to this configuration, since the signal line having a desired thickness can be formed on the substrate surface, the electromechanical filter that is easy to manufacture and has the high durability can be formed. Also, the reliability can be further enhanced.

Also, in the electromechanical filter of the present invention, the signal line is formed over the magnetic material film pattern to oppose thereto at a predetermined interval. According to this configuration, the formation of the ferromagnetic material can be facilitated. Since the formation of the ferromagnetic material can be accomplished by the lower layer step, the degradation of the electrode material, etc. that are ready to occur in forming the film of the ferromagnetic material.

Also, the electromechanical filter of the present invention further includes first and second drive electrodes formed on a substrate surface and constructed to vary a potential, a conductor pattern arranged to oppose to the first drive electrode at a predetermined interval and to constitute the signal line, and a magnetic field generating portion comprising a magnetic material film pattern that is magnetized to have a magnetic field component that intersects orthogonally with the signal line, wherein the signal line is displaced by changing a potential of the first drive electrode, the magnetic material film pattern is displaced by changing a potential of the second drive electrode, and a ferromagnetic resonance frequency is changed by changing the magnetic field generated by the magnetic material film pattern on the signal line.

According to this configuration, since positions of the magnetic field and the signal line can be changed by the first and second drive electrodes respectively, the tuning can be executed with higher precision.

Also, the electromechanical filter of the present invention further includes a first conductor acting as the signal line, a magnetic field generating portion for generating the magnetic field passing through the first conductor, a drive electrode for varying the magnetic field passing through the signal line by displacing relative positions of the first conductor and the magnetic field generating portion, and a second conductor acting as a signal line that transmits an induced electromotive force induced by a resonance between a magnetic field generated by a high-frequency current passing through the first conductor and the magnetic field generated by the magnetic field generating portion.

According to this configuration, when the signal is input into the first conductor, the high-frequency magnetic field is generated around the magnetic field generating portion by the high-frequency current. The precession of the spin is excited in the magnetic field generating portion by the high-frequency magnetic field (kittel mode). An induced electromotive force is generated in the first conductor by the magnetic field generated in this mode. Then, the ferromagnetic resonance phenomenon occurs only when the signal of the ferromagnetic resonance frequency of the magnetic field generating portion is input, so that an angle of the precession of the spin in the magnetic field generating portion is maximized and also a magnitude of the induced electromotive force is maximized. In this manner, the second conductor can output the signal by the induced electromotive force, and thus only the signal of the particular frequency decided by the ferromagnetic resonance frequency can propagate to the second conductor.

Also, in the electromechanical filter of the present invention, the first conductor and the second conductor are arranged to intersect orthogonally with each other.

According to this configuration, an interference of mutual signals can be eliminated, and the signal output without noise can be realized.

Also, in the electromechanical filter of the present invention, the first conductor and the second conductor are arranged in parallel at a predetermined interval.

Accordingly, a reduction in size can be achieved.

Also, the electromechanical filter of the present invention contains the electromechanical filter that realizes a tunable band-pass filter function by aligning and connecting a plurality of the electromechanical filters.

Also, the electromechanical filter of the present invention contains the electromechanical filter that realizes a tunable band-stop filter function by aligning and connecting a plurality of the electromechanical filters.

Advantages of the Invention

As described above, according to the present invention, an electrode serving as the signal line, a magnetic field generating portion, and a mechanism for moving these portions are provided. Therefore, only a signal of a predetermined frequency can be output selectively to pass or cut off, and the predetermined frequency can be tuned.

Figure 1:
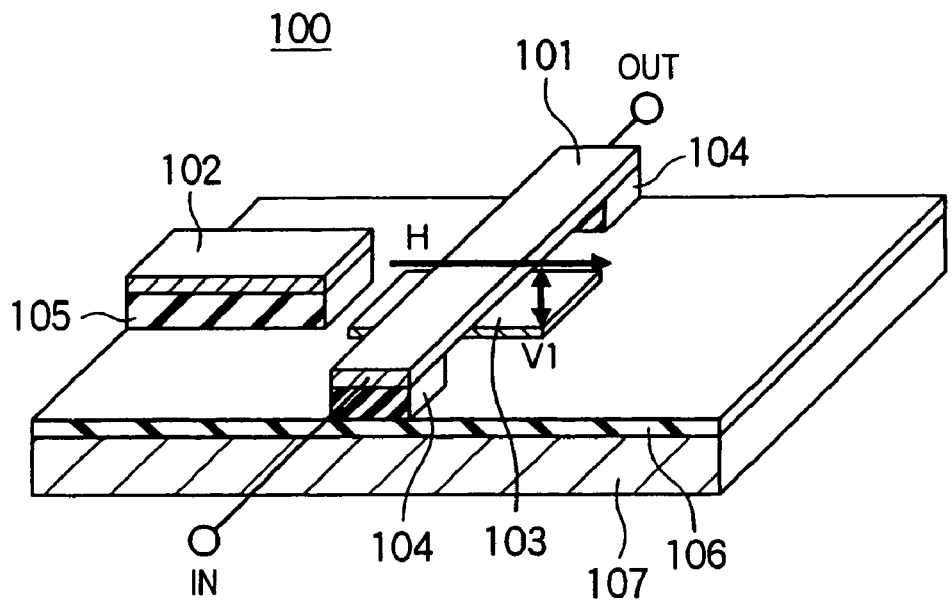
[FIG. 1] (a) is a perspective view showing a configuration of an electromechanical filter in an embodiment 1 of the present invention, and (b) is a sectional view showing the configuration of the electromechanical filter in the embodiment 1 of the present invention.
Figure 1:
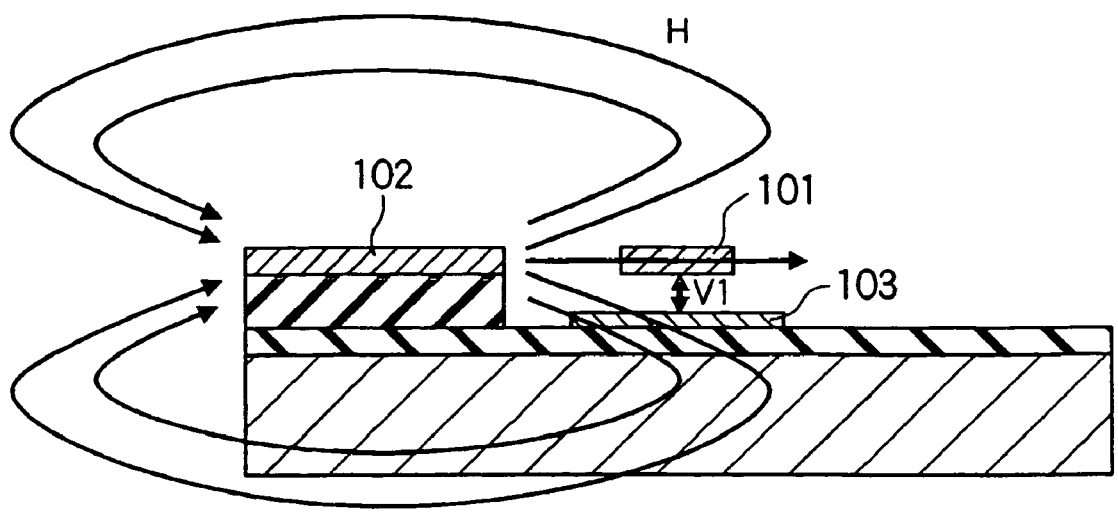

DESCRIPTION OF REFERENCE NUMERALS AND SIGNS 100, 100a, 400, 500, 600, 700, 800 electromechanical filter
101 movable electrode
102 magnetic material
103, 110 drive electrode
104 post
105, 108 spacer
106 insulating film
107 substrate
109 stem
111, 112 fixed electrode Best Mode for Carrying Out the Invention Respective embodiment of the present invention will be explained in detail with reference to the drawings hereinafter.

Embodiment 1

FIGS. 1(a) and (b) are a perspective view and a sectional view showing a configuration of an electromechanical filter in an embodiment 1 of the present invention respectively. In an electromechanical filter 100, a magnetic generating portion that generates a magnetic field to pass through a signal line is positioned with respect to the signal line, then relative positions of the signal line and the magnetic generating portion are displaced by an electrostatic force to change the magnetic field passing through the signal line, then the ferromagnetic resonance frequency is tuned by vector-modulating relatively a high-frequency magnetic field generated by a current passing through the signal line and a DC bias magnetic field intersecting with the above magnetic field. Thus, a band-stop filter capable of tuning the ferromagnetic resonance frequency and also absorbing a signal of a particular frequency out of signals passing through a movable electrode 101 can be constructed.

As shown in FIG. 1(a), in this electromechanical filter 100, an insulating film 106 made of a double-layer film consisting of a silicon oxide film and a silicon nitride film is formed on a surface of a gallium arsenide (GaAs) substrate 107, and then two posts 104 are arranged on edges of the substrate 107 to protrude therefrom. Then, the movable electrode 101 bridged over a space between the posts 104 to constitute a fixed beam, a signal input port IN for inputting the signal to the movable electrode 101, and a signal output port OUT for outputting the signal from the movable electrode 101 to the outside are provided.

A drive electrode 103 is provided below the movable electrode 101 to oppose to the movable electrode 101. The movable electrode 101 can be displaced downward by the electrostatic force generated by a potential difference between the movable electrode 101 and the drive electrode 103.

A magnetic material 102 is provided in a position, which is away from the movable electrode 101 by a predetermined distance, to apply the DC bias magnetic field H to the movable electrode 101. Since the magnetic material 102 must be provided in a position, which is optimized relatively to a displacement range of the movable electrode 101, to apply the desired DC bias magnetic field H to the movable electrode 101, such magnetic material 102 is provided on the GaAs substrate 107 via a spacer 105.

Next, a tunable filtering mechanism in this electromechanical filter 100 will be explained hereunder.

FIG. 1(b) is a sectional view showing the configuration of the electromechanical filter in the embodiment 1 of the present invention. The signal input from the signal input port IN propagates through the movable electrode 101, and is output to the signal output port OUT. In this case, because the movable electrode is positioned in the DC bias magnetic field H generated by the magnetic material 102, a signal filtering is generated by the ferromagnetic resonance phenomenon and thus only the signal of a particular frequency decided by the ferromagnetic resonance frequency can be transmitted to the signal output port OUT. Here, the signal of the ferromagnetic resonance frequency is absorbed and then the signal of the frequency except the ferromagnetic resonance frequency is transmitted.

In the electromechanical filter of the present invention, a tunable function as well as the signal filtering function is added. In order to tune the frequency of the signal that can pass through the filter, the ferromagnetic resonance frequency $f_r$ must be varied. For this purpose, the DC bias magnetic field H in Eq. (1) expressing the ferromagnetic resonance frequency $f_r$ should be varied.

$$f_r = \frac{\gamma}{2\pi}\{(H+H_a)(H+H_a+I_s/\mu_0)\}^{1/2} \quad \text{Eq. (1)}$$

$$H_a = 2K_1/I_s = 44.7\,\text{kA/m}(\cong 560\,\text{Oe}) \quad \text{Eq. (2)}$$

As shown in FIG. 1(b), the DC bias magnetic field H is generated radially from the magnetic material 102. In the electromechanical filter, the movable electrode 101 serving as the signal line can be set to move in the DC bias magnetic field H. A moving direction of the movable electrode 101 is indicated by V1.

According to such mechanism, the vector and the intensity of the DC bias magnetic field passing through the movable electrode can be varied, so that the ferromagnetic resonance frequency can be changed.

Figure 2:
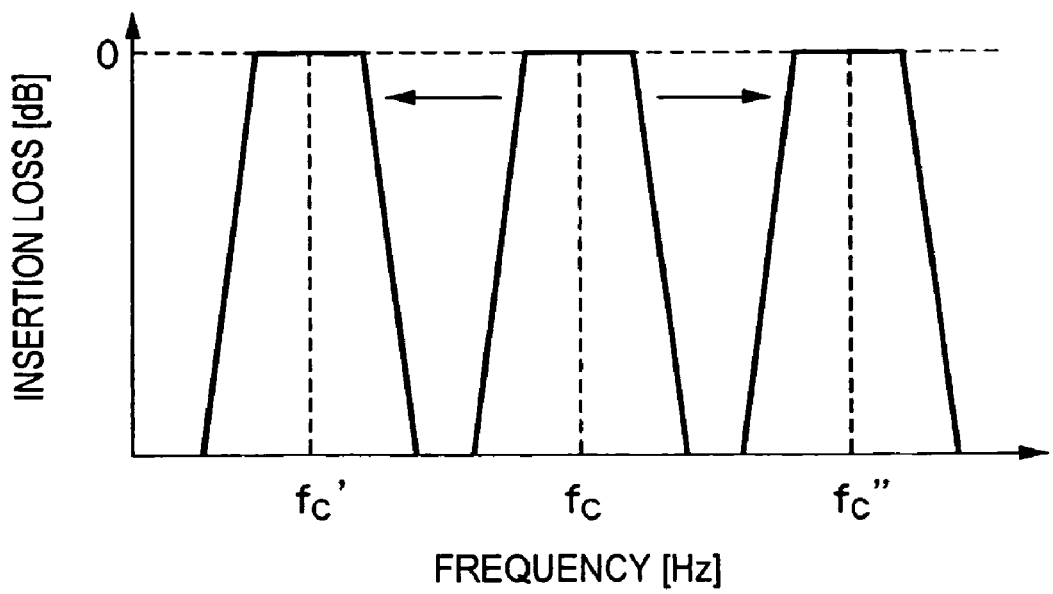
[FIG. 2] A view showing a tunable filtering characteristic of the electromechanical filter in the embodiment 1 of the present invention, wherein (a) is a view showing a band-pass characteristic, and (b) is a view showing a band-stop characteristic.
Figure 2:
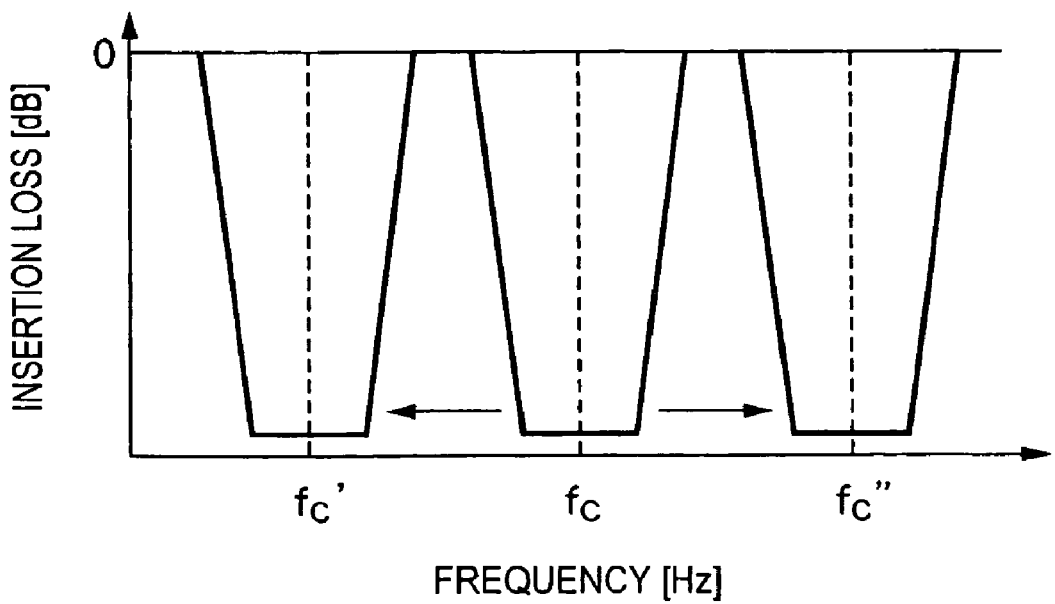

FIGS. 2(*a*) and (*b*) are views showing the tunable filtering characteristic of the electromechanical filter in the embodiment 1 of the present invention. In Figures, a band-pass characteristic and a band-stop characteristic are shown as an application of the electromechanical filter of the present invention. But the illustrated band-pass filter can be realized by connecting the electromechanical filters of the present invention in series. The frequency can be tuned to a low frequency $f_c'$ side and a high frequency $f_c''$ side from a filtering center frequency $f_c$.

In this case, since the center frequency of the filter characteristic and the tunable range depend on the DC bias magnetic field H in the displacement range of the movable electrode 101, initial states of the magnetic material 102 are important. The axis of easy magnetization decided by the depositing conditions of the magnetic material film and the magnetizing direction decided by the external magnetic field applied after the deposition of the magnetic material 102 must be set along the direction from the magnetic material 102 to the movable electrode 101. Also, since the movable electrode 101 is displaced in the desired DC bias magnetic field H, relative positions such as a distance between the movable electrode 101 and the magnetic material 102, respective heights, etc., a distance between the movable electrode 101 and the drive electrode 103, and shapes such as a thickness, a width, etc. of the magnetic material 102 to generate the desired DC bias magnetic field H must be optimized in response to the required tunable filter characteristic.

In this manner, according to the electromechanical filter 100, only the signal of the predetermined frequency can be selected and output, and the predetermined frequency can be tuned.

Figure 3:
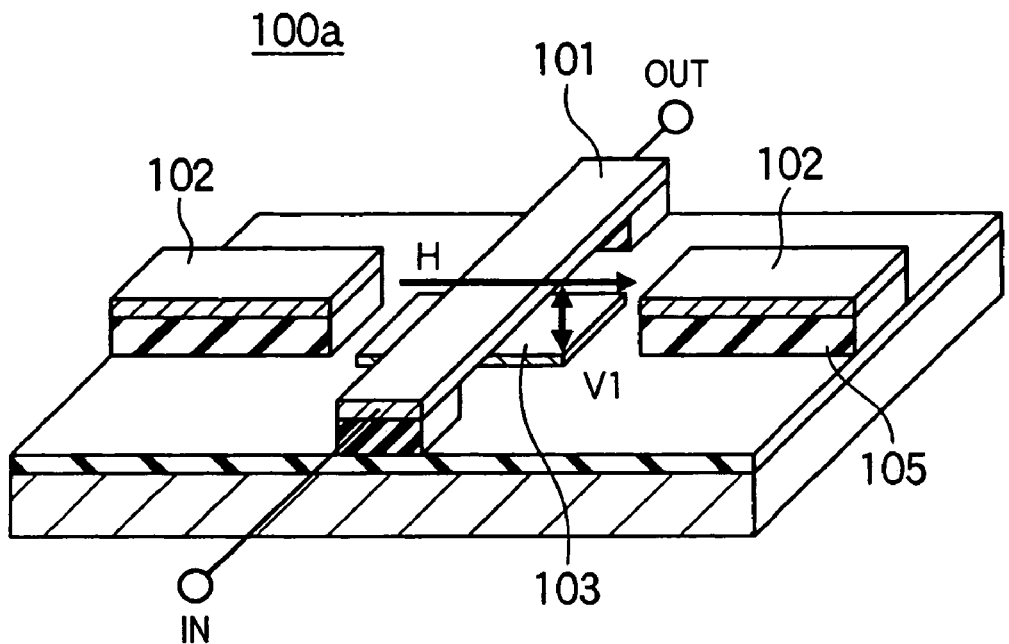
[FIG. 3] (a) is a perspective view showing a variation of the electromechanical filter in FIG. 1, and (b) is a sectional view showing the variation of the electromechanical filter in FIG. 1.
Figure 3:
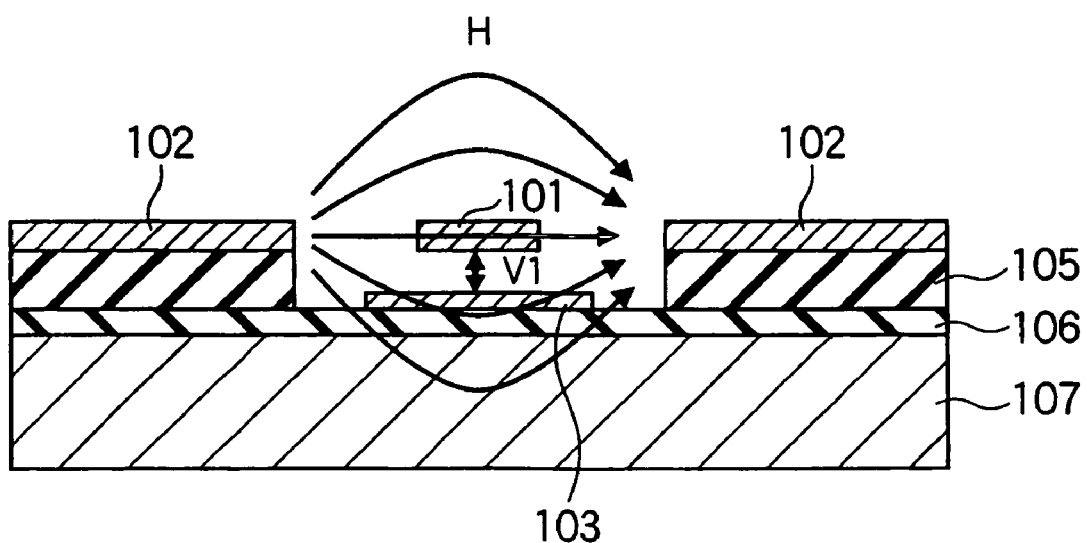

FIGS. 3(*a*) and (*b*) are a perspective view and a sectional view showing a variation of the electromechanical filter in the embodiment 1 of the present invention respectively.

In the electromechanical filter 100 shown in the embodiment 1, the DC bias magnetic field H is generated by one magnetic material 102. In contrast, as shown in FIG. 3(*a*), in an electromechanical filter 100*a* as a variation of the electromechanical filter in the embodiment 1, the DC bias magnetic field H different from that in the electromechanical filter 100 is generated by positioning two magnetic materials 102 to put the movable electrode 101 between them.

As apparent from FIG. 3(*b*), it is understood that the DC bias magnetic field H is generated across the movable electrode 101. In this case, control and magnetization of the axis of easy magnetization must be applied to magnetize both two magnetic materials 102 in the same direction.

Figure 4:
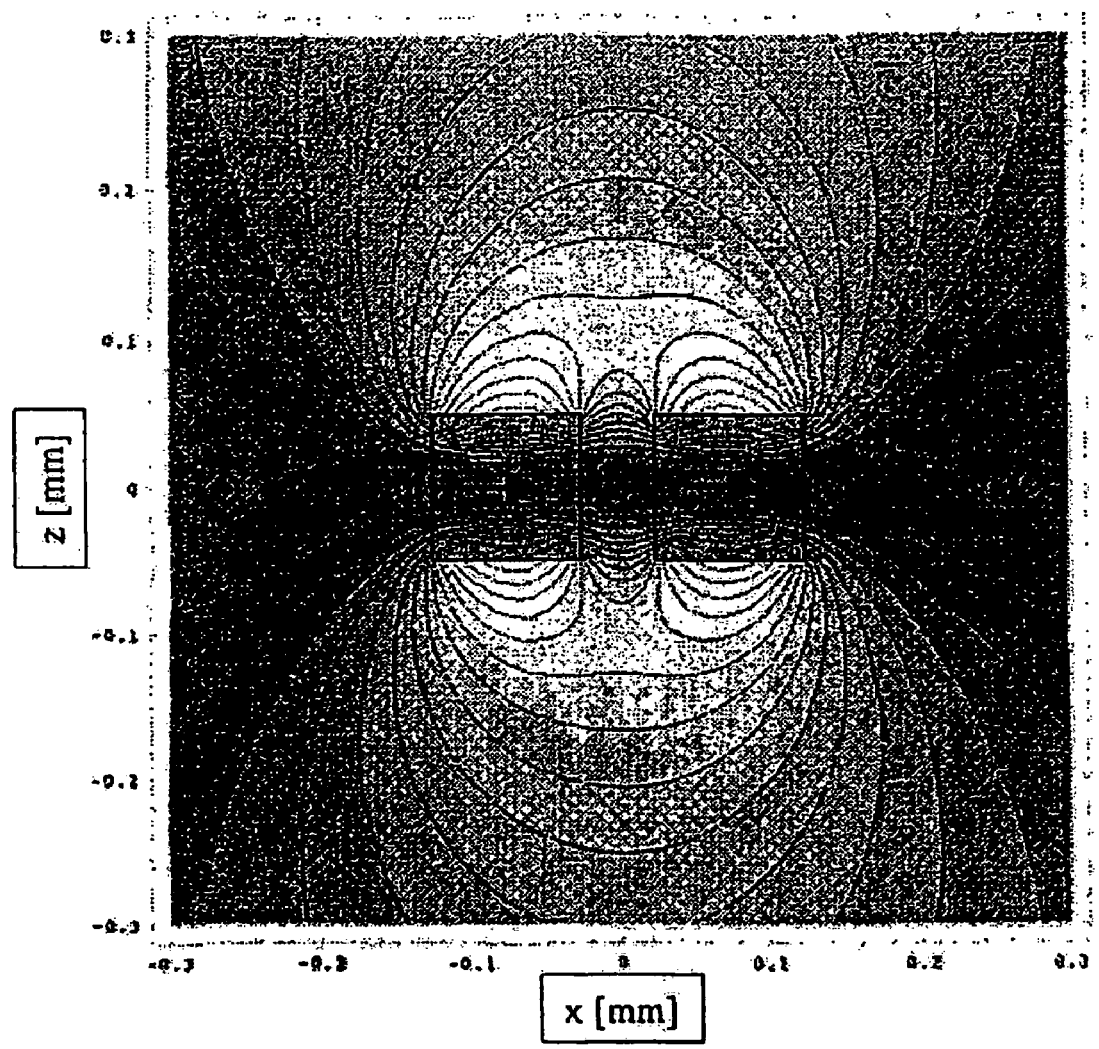
[FIG. 4] A view showing the simulation result of a generation pattern of a DC bias magnetic field H formed by two magnetic materials 102.

FIG. 4 is the simulation result of a generated pattern of the DC bias magnetic field H formed by two magnetic materials 102. Where, x is a horizontal direction of a substrate surface, and z is a vertical direction to the substrate surface. By way of example, the case where two magnetic materials 102 each having a diameter 100 μm and a length 100 μm are arranged at a distance of 50 μm is illustrated. A length direction is set in the x-direction. The magnetization M of two magnetic materials 102 is set in the same direction in the x-direction, and lines of magnetic force generated from the magnetic materials 102 respectively are coupled together to form the DC bias magnetic field H. A curve denotes a line of magnetic force and a shade of color denotes an intensity of the DC bias magnetic field H. Thus, the DC bias magnetic field H becomes stronger as a density of the line of magnetic force is denser and the color is lighter.

Figure 5:
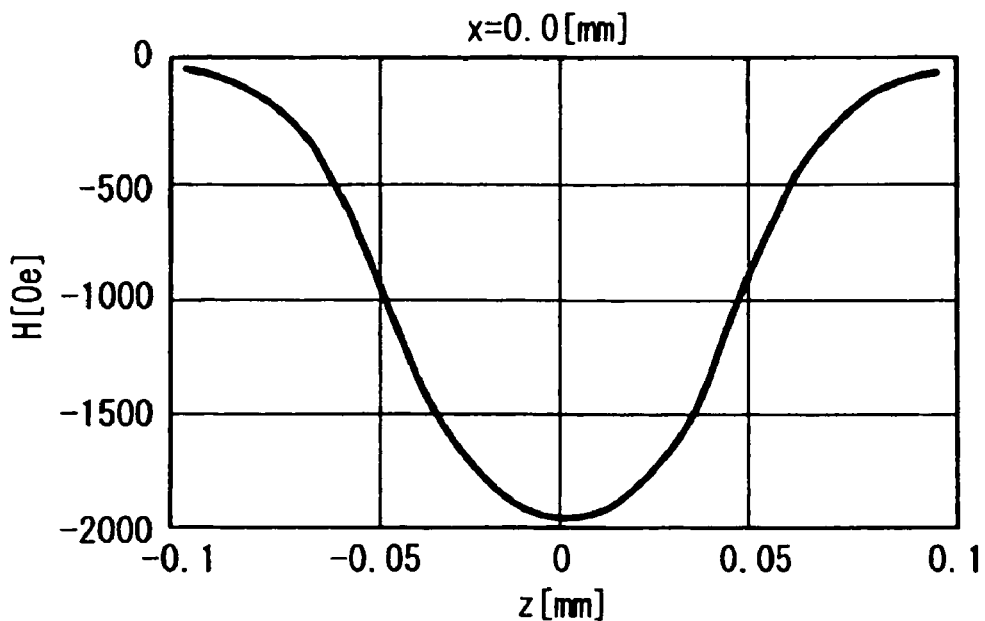
[FIG. 5] A view showing an intensity of the DC bias magnetic field H in respective positions in the z-direction when x=0 µm.

In FIG. 5, an intensity of the DC bias magnetic field H in respective positions in the z-direction when x=0 μm is shown. It can be seen that, when the position is moved downward by several tens μm from the initial position of z=100 μm, the intensity of the DC bias magnetic field H is changed by several 100 Oe. For example, the DC bias magnetic field H can be changed by 100 Oe at an amount of downward displacement of 20 μm or less in the z-direction.

The ferromagnetic resonance frequency $f_r$ and the tuning range of the resonance frequency when the movable electrode 101 is moved in such DC bias magnetic field H are calculated. The ferromagnetic resonance frequency $f_r$ is given by above Eq. (1). Where γ is a gyromagnetic constant ($1.105 \times 10^5$ g [$A^{-1} m \cdot s^{-1}$], g: Land'e's factor), $H_a$ is an anisotropic magnetic field (A/m), $I_s$ is a saturation magnetic field (T), and H is the DC bias magnetic field. When the single crystal Fe film serving as the ferromagnetic material is used as the magnetic materials 102, the anisotropic magnetic field $H_a$ is given by Eq. (2) from the crystal magnetic anisotropy constant $K_1 \sim 48$ kl/m$^3$ and the saturation magnetization $I_s \sim 2.15$ T. In the transition metal Fe, g~2 is given.

When the movable electrode 101 is positioned at the initial position of z=100 μm, the ferromagnetic resonance frequency becomes about 9.85 GHz because the external DC bias magnetic field H is zero. Then, in order to tune the resonance frequency, a voltage is applied between the movable electrode 101 and the drive electrode 103 to move downward the movable electrode 101 by an electrostatic force. When the movable electrode 101 is displaced by about 20 μm and positioned at z=80 μm, the DC bias magnetic field H is 100 Oe and the resonance frequency is about 10.72 GHz. That is, a tuning range of about 1 GHz can be accomplished by an amount of displacement of about 20 μm of the movable electrode 101.

In addition, since the intensity of the DC bias magnetic field H is changed several 100 Oe in the position where the movable electrode 101 is moved from the initial position of z=100 μm by several tens μm, a large tuning range of about 10 GHz can also be accomplished.

Here, when the linear change of the resonance frequency with respect to a movement of the movable electrode 101 is requested, a range in which a relationship between the position and the DC bias magnetic field H is linear should be applied. Also, when the tuning is excessively sharp with respect to the position, a range in which a relationship between the position and the DC bias magnetic field H is gentle should be applied. In this case, controllability of the resonance frequency can be improved.

As described above, the ferromagnetic resonance frequency can be tuned by changing the intensity of the DC bias magnetic field H, so that the tunable filter can be realized.

Figure 6:
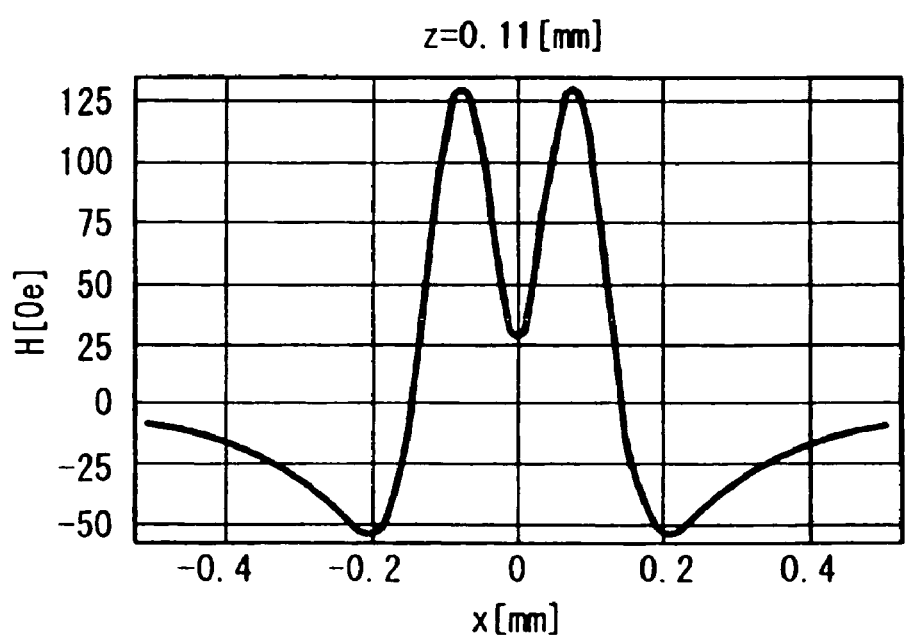
[FIG. 6] A view showing an intensity of the DC bias magnetic field H in respective positions in the x-direction when z=110 µm in FIG. 4.

In this case, FIG. 3(*b*) shows an example, various DC bias magnetic fields H can be formed by changing the number and the position of the magnetic materials. For example, the intensity of the DC bias magnetic field H in respective positions in the x-direction when z=110 μm in FIG. 4 is shown in FIG. 6. A behavior of the intensity of the DC bias magnetic field H with respect to the position is largely different from FIG. 5. Thus, if the movable electrode 101 is driven in the x-direction, the device whose ferromagnetic resonance frequency and tuning range of the resonance frequency are different can also be realized (This particular example is shown in an embodiment 2).

As described above, if the vector and the intensity of the DC bias magnetic field H passing through the movable electrode 101 are controlled, the center frequency of the filter characteristic and the tunable range of the center frequency can be controlled.

Here, a width of the movable electrode 101 can be set to about 45 μm, which is smaller than 50 μm, such that the movable electrode 101 can enter into a space between the magnetic materials 102, and also a thickness of 0.7 μm and a length of 500 μm, which constitute a high aspect ratio, can be set to lower a spring force such that a large amount of displacement can be obtained by a low voltage. In this case, because the movable electrode 101 may be displaced only over the magnetic materials 102, respective sizes are not always limited to above values.

Also, the driving method is not restricted to the electrostatic force driving. A piezoelectric force driving, a Lorentz force driving, or the like, which does not depend on an interval between the movable electrode 101 and the drive electrode 103, may be employed. Also, a mechanism for fixing the movable electrode 101 to a predetermined position may be provided. As a driving method in that mechanism, the electrostatic force driving, the piezoelectric force driving, the Lorentz force driving, or the like may be employed.

In the electromechanical filter 100a in the present embodiment, the same names and symbols are affixed to the same portions as those in the electromechanical filter 100 in the embodiment 1, and their explanation will be omitted herein.

Next, a method of manufacturing the electromechanical filter 100a shown in the embodiment 1 will be explained hereunder.

FIGS. 7(a) to (e) and FIGS. 8(a) to (d) are sectional views showing steps of manufacturing the electromechanical filter in the embodiment 1 of the present invention in stages.

Figure 7:
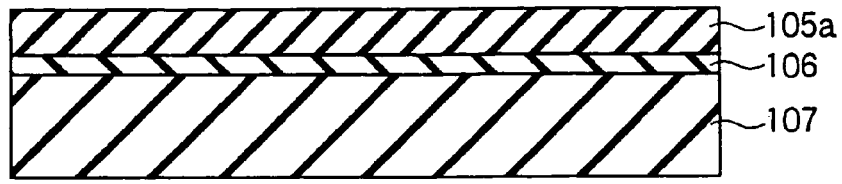
[FIG. 7] Sectional views showing steps of manufacturing the electromechanical filter in the embodiment 1 of the present invention in stages.
Figure 7:
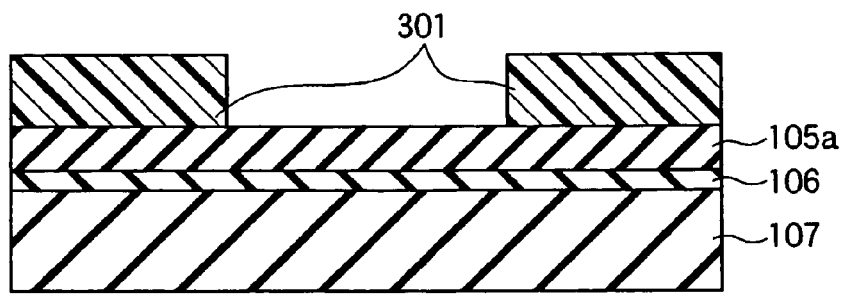
Figure 7:
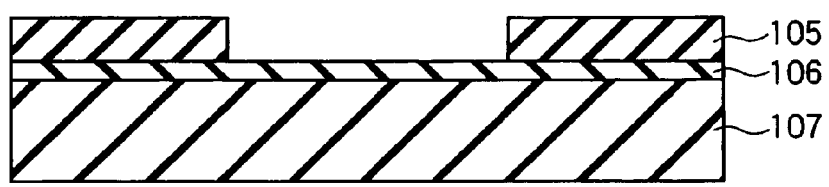
Figure 7:
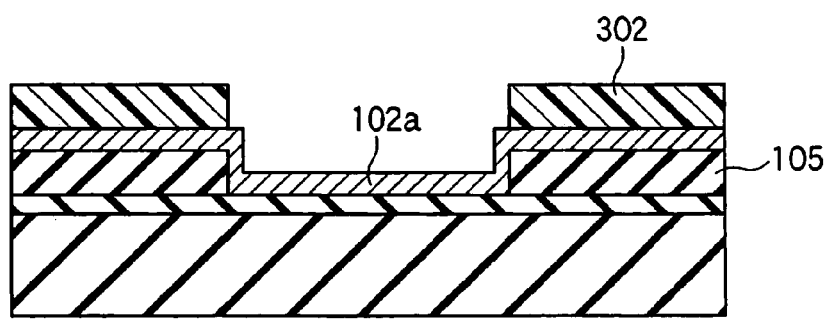
Figure 7:
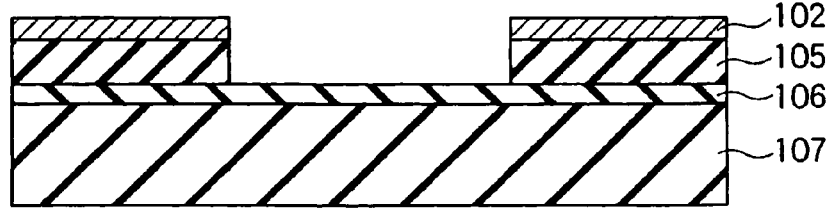
Figure 7:
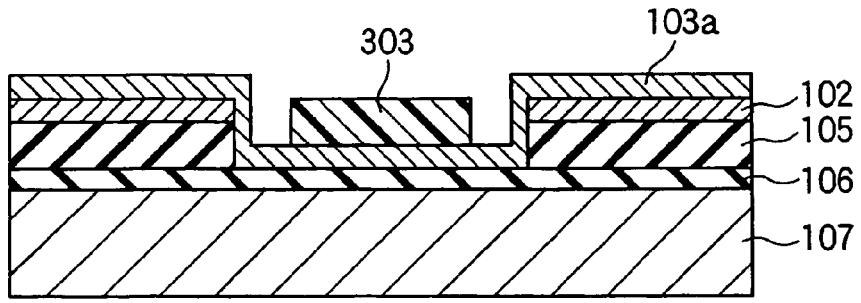
Figure 7:
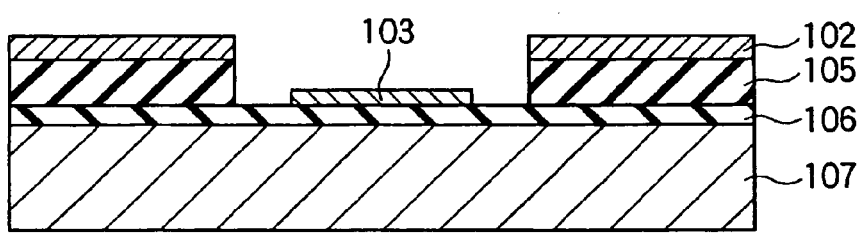
Figure 7:
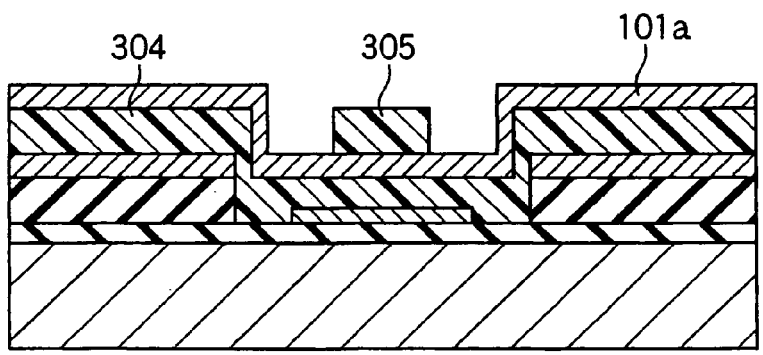
Figure 7:
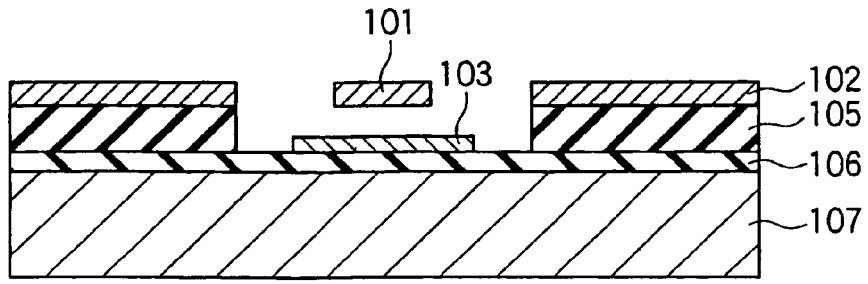

First, as shown in FIG. 7(a), for example, the insulating film 106 made of a double-layer film consisting of a silicon oxide film and a silicon nitride film is formed on the substrate 107 such as the GaAs substrate, or the like. Then, a silicon oxide film 105a used as the spacer material acting as the spacer 105 is formed by the sputter.

Then, as shown in FIG. 7(b), a photoresist 301 used to form the silicon oxide film 105a by the dry etching is patterned by the photolithography.

Then, the silicon oxide film 105a as the spacer material is dry-etched by using the photoresist 301 as a mask, and then the photoresist 301 is removed by the ashing. As shown in FIG. 7(c), the silicon oxide film 105a left on the substrate 107 after the photoresist 301 is removed in this manner gives the spacer 105.

Then, the magnetic materials 102 will be formed hereunder.

As shown in FIG. 7(d), a magnetic thin film 102a made of Fe, Co, Ni, or the like is deposited on the spacers 105 and the insulating film 106 by the sputter. Then, a photoresist 302 used to form a magnetic material pattern by the photolithography is formed thereon.

Then, the magnetic thin film 102a is dry-etched, and the photoresist 302 is removed by the ashing. Thus, as shown in FIG. 7(e), the magnetic material 102 is formed on the spacers 105 respectively.

Then, the drive electrode 103 will be formed hereunder.

Figure 8:
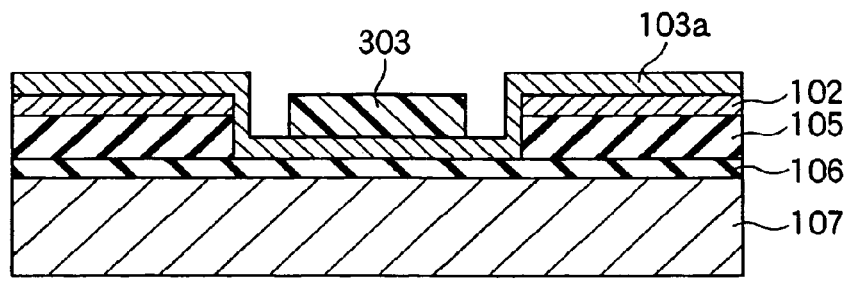
[FIG. 8] Sectional views showing steps of manufacturing the electromechanical filter in the embodiment 1 of the present invention in stages.
Figure 8:
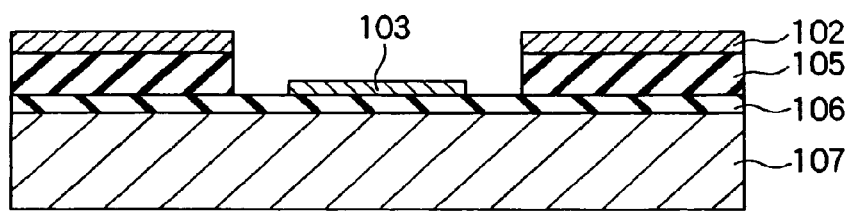
Figure 8:
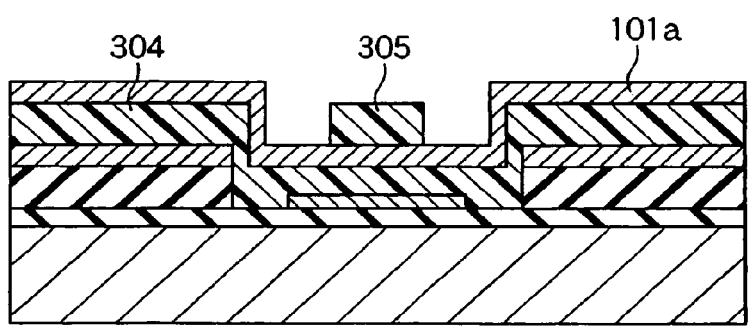
Figure 8:
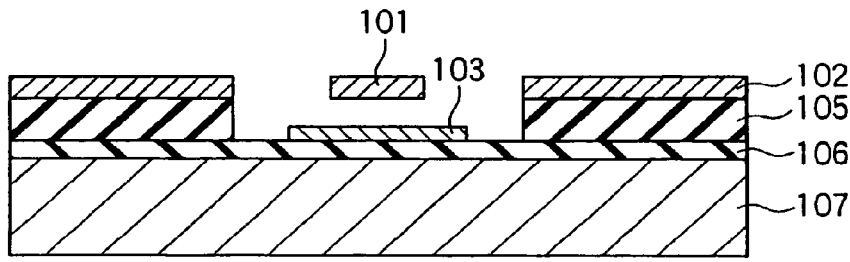

As shown in FIG. 8(a), a metal thin film 103a made of Al, or the like is deposited on an overall surface of the substrate, on which the magnetic materials 102 and the insulating film 106 are formed, by the sputter. Then, a photoresist 303 that is patterned into a drive electrode pattern by the photolithography is formed thereon.

Then, the metal thin film 103a is dry-etched, and the photoresist 303 is removed by the ashing. Thus, as shown FIG. 8(b), the magnetic material 102 is formed on the spacers 105 respectively.

Finally, the movable electrode 101 will be formed hereunder.

As shown in FIG. 8(c), a photoresist 304 that is patterned into sacrifice layer patterns is formed on the magnetic materials 102, the drive electrode 103, and the insulating film 106. Then, a metal thin film 101a such as Al, or the like is deposited by the sputter, and then a photoresist 305 that is patterned into a movable electrode pattern by the photolithography is formed thereon.

Then, the metal thin film 101a is dry-etched, and the photoresist 304 is removed by the ashing. Thus, as shown in FIG. 8(d), the movable electrode 101 having a hollow structure is formed.

Here, in case it is assured that there is no possibility that a large loss occurs even when the high-frequency signal that propagates through the movable electrode 101 acting as the signal line also propagates over the substrate 107, the insulating film 106 may be omitted.

Here, in case it is assured that there is no possibility that a large loss occurs even when the high-frequency signal that propagates through the movable electrode 101 acting as the signal line also propagates over the substrate 107, the insulating film 106 may be omitted.

Also, a multistage filter configuration in which the electromechanical filters of the present invention are connected in parallel or in series may be employed.

Also, as the magnetic field generating portion, a coil may be formed in place of the magnetic material 102 to generate the similar DC bias magnetic field H. Also, the variable DC bias magnetic field H or the AC bias magnetic field may be generated by using a variable inductor constructed by the MEMS technology.

Also, in the embodiment 1, one drive electrode 103 is provided and then the movable electrode 101 constituting the signal line is moved in one vertical direction. But a plurality of drive electrodes 103 may be provided and then the moving direction V1 of the movable electrode 101 may be set in plural directions.

Embodiment 2

Figure 9:
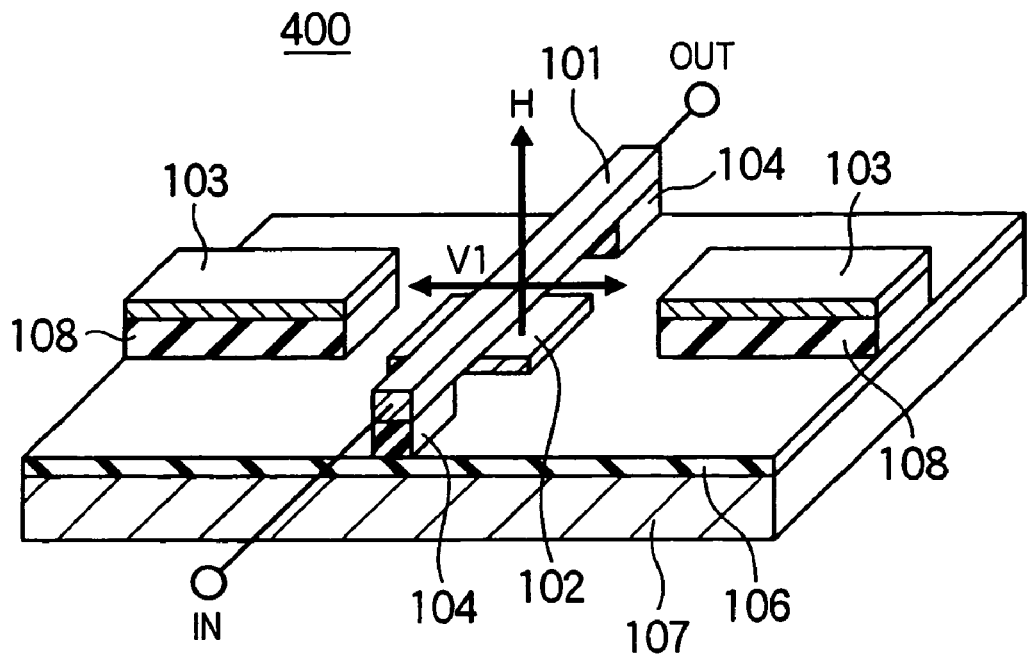
[FIG. 9] (a) is a perspective view showing a configuration of an electromechanical filter in an embodiment 2 of the present invention, and (b) is a sectional view showing the configuration of the electromechanical filter in the embodiment 2 of the present invention.
Figure 9:
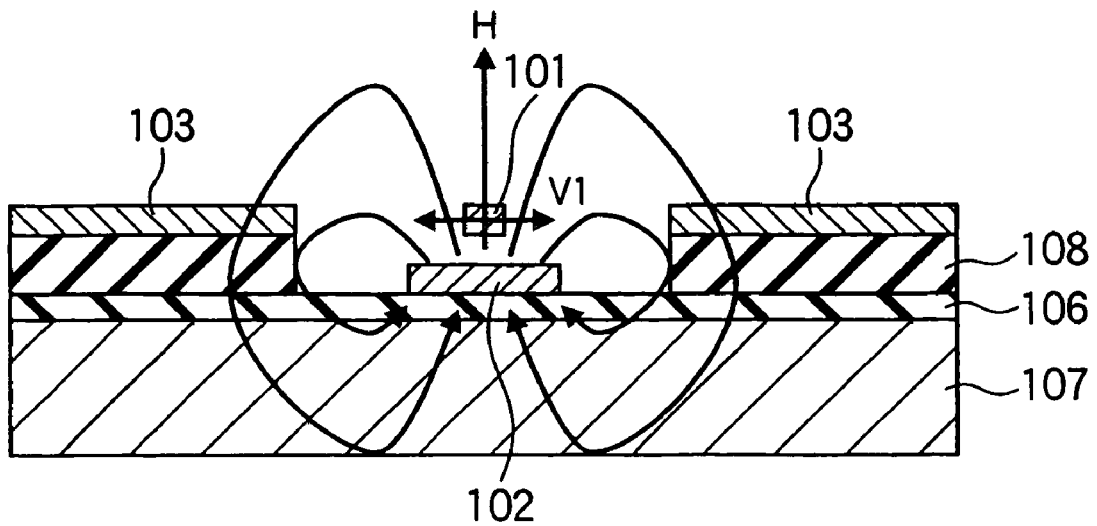

FIGS. 9(a) and (b) is a perspective view and a sectional view showing a configuration of an electromechanical filter in an embodiment 2 of the present invention respectively.

In the present embodiment, as described above, a plurality of drive electrodes 103 are provided and then the moving direction V1 of the movable electrode 101 are set in plural directions. The magnetic material is formed on the surface of the substrate such that the magnetic material 102 is positioned just below the movable electrode 101. In other words, the drive electrodes 103 are provided on both sides to put the movable electrode 101 constituting the signal line between them, and the magnetic material 102 is arranged just below this signal line such that the magnetic field is applied in the direction perpendicular to the substrate.

In an electromechanical filter 400, as shown in FIG. 9(a), the movable electrode 101 bridged over the space between the posts 104, the signal input port IN for inputting the signal into the movable electrode 101, and the signal output port OUT for outputting the signal from the movable electrode 101 to the outside are provided on the substrate 107 on the surface of which the insulating film 106 is formed.

The drive electrodes 103 are provided on both sides of the movable electrode 101 to put the movable electrode 101 between them. Thus, the movable electrode 101 can be moved in two horizontal directions V1 by the electrostatic force generated by a potential difference between the movable electrode 101 and the drive electrodes 103. Since the drive electrodes 103 must provide a desired driving force to the movable electrode 101, they are provided on the substrate 107 via a spacer 108 respectively in such a manner that they are provided in positions that are optimized relatively to the movable electrode 101.

The magnetic material 102 for applying the DC bias magnetic field H to the movable electrode 101 is provided below the movable electrode 101.

In the electromechanical filter 100 and the electromechanical filter 100a in the embodiment 1, the DC bias magnetic field H is applied along the horizontal direction and the moving direction of the movable electrode 101 is set in the vertical direction. In contrast, in the electromechanical filter 400 in the embodiment 2, the DC bias magnetic field H is applied along the vertical direction and the moving direction of the movable electrode 101 is set in the horizontal direction.

In this manner, the profile of the DC bias magnetic field H and the moving direction and the moving range of the movable electrode 101 moved in such magnetic field, that the configurations of the electromechanical filter 100 and the electromechanical filter 100a in the embodiment 1 and the method of manufacturing the same are difficult to constitute, can be realized by changing the configuration.

Next, the tunable filtering mechanism in the electromechanical filter 400 will be explained hereunder.

FIG. 9(b) is a sectional view showing the configuration of the electromechanical filter in the embodiment 2 of the present invention. The signal being input from the signal input port IN propagates through the movable electrode 101, and is output to the signal output port OUT. In this case, since the movable electrode is positioned in the DC bias magnetic field H that the magnetic material 102 generates, the signal filtering due to the ferromagnetic resonance phenomenon occurs. Thus, only the signal of the particular frequency that is decided by the ferromagnetic resonance frequency can propagate to the signal output port OUT.

In addition to this signal filtering function, a tunable function is added to the electromechanical filter of the present invention. The ferromagnetic resonance frequency $f_r$ must be varied to make the frequency of the signal that can pass through the filter tunable. For that purpose, the DC bias magnetic field H in Eq. (1) expressing the ferromagnetic resonance frequency $f_r$ should be made variable.

As shown in FIG. 9(b), the DC bias magnetic field H is generated radially from the magnetic material 102. In the electromechanical filter of the present invention, the movable electrode 101 as the signal line can be moved in the DC bias magnetic field H. The moving direction of the movable electrode 101 is indicated by V1.

According to such mechanism, the vector and the intensity of the DC bias magnetic field H that pass through the movable electrode can be varied and also the ferromagnetic resonance frequency can be changed.

In this case, the center frequency of this filtering characteristic and the tunable range depend on the intensity and the vector of the DC bias magnetic field H in the displacement range of the movable electrode 101. Therefore, the axis of easy magnetization decided by the deposition conditions of the magnetic material 102 and the magnetization direction decided by the external magnetic field applied after the magnetic material 102 is deposited must be directed from the magnetic material 102 to the movable electrode 101. Also, since the movable electrode 101 moves in the desired DC bias magnetic field H, relative positions such as a distance between the movable electrode 101 and the magnetic material 102, heights, etc., a distance between the movable electrode 101 and the drive electrode 103, and shapes such as a thickness, a width, etc. of the magnetic material 102 used to generate the desired DC bias magnetic field H must be optimized in response to the required tunable filter characteristic.

In this manner, according to the electromechanical filter 400, only the signal of a predetermined frequency can be selected and output, and the predetermined frequency can be tuned.

As for the method of manufacturing the electromechanical filter 400, the uniformalization of the manufacture and the manufacturing method can be attained if simply the magnetic thin film 102a and the metal thin film 103a used in the method of manufacturing the electromechanical filter 100 or the electromechanical filter 100a are replaced with the metal thin film 103a made of Al, or the like and the magnetic thin film 102 made of Fe, Co, Ni, or the like respectively.

In this case, a multistage filter configuration in which the electromechanical filters of the present invention are connected in parallel or in series may be employed.

Also, as the magnetic field generating portion, a coil may be formed in place of the magnetic material 102 to generate the similar DC bias magnetic field H. Also, the variable DC bias magnetic field H or the AC bias magnetic field may be generated by using the variable inductor constructed by the MEMS technology.

Also, in the embodiment 2, two drive electrodes 103 are provided and the movable electrode 101 can be moved in two horizontal directions. Either of two drive electrodes 103 may be employed, and either of two directions may be employed as the moving direction V1 of the movable electrode 101.

Also, in the embodiment 2, two drive electrodes 103 are provided and the movable electrode 101 can be moved in two horizontal directions. A plurality of drive electrodes 103 may be employed, and the moving direction V1 of the movable electrode 101 may be set in plural directions.

Also, formation of the fine high-precision beam with good workability can be facilitated by using the carbon nanotube.

Embodiment 3

Figure 10:
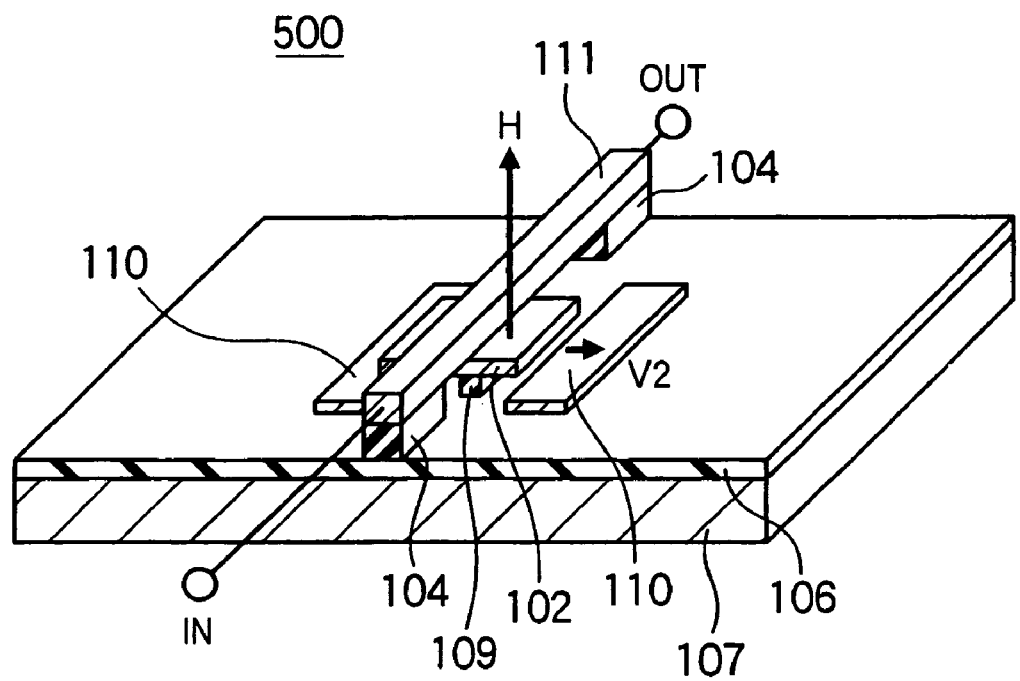
[FIG. 10] (a) is a perspective view showing a configuration of an electromechanical filter in an embodiment 3 of the present invention, and (b) is a sectional view showing the configuration of the electromechanical filter in the embodiment 3 of the present invention.
Figure 10:
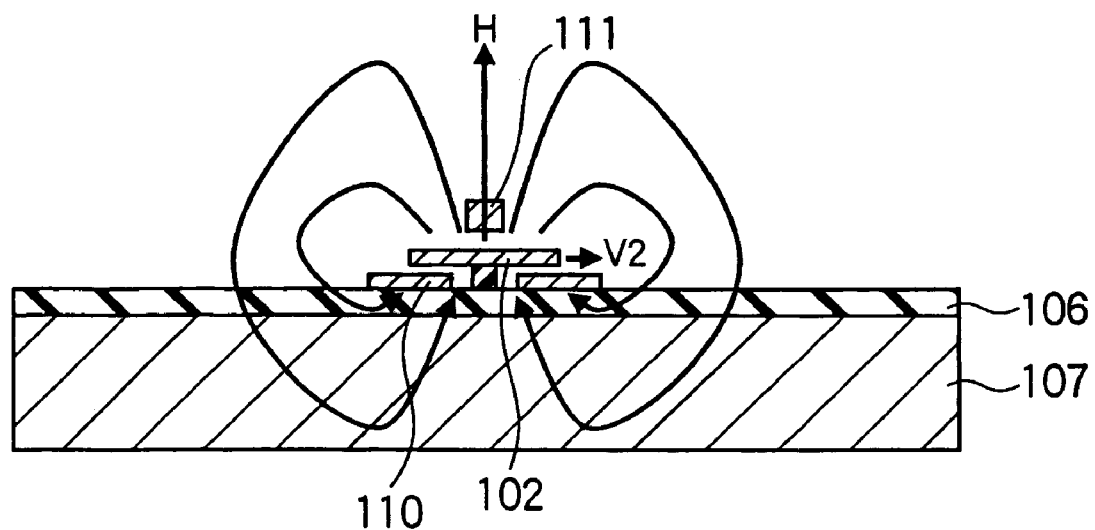

FIGS. 10(a) and (b) are a perspective view and a sectional view showing a configuration of an electromechanical filter in an embodiment 3 of the present invention respectively.

In an electromechanical filter 500 shown in FIG. 10(a), a fixed electrode 111 bridged over the space between the posts 104, a signal input port IN for inputting the signal into the fixed electrode 111, and a signal output port OUT for outputting the signal from the fixed electrode 111 to the outside are provided on the substrate 107 on the surface of which the insulating film 106 is formed.

The magnetic material 102 for applying the DC bias magnetic field H to the fixed electrode 111 is provided below the fixed electrode 111. The magnetic material 102 is provided on a stem 109. A drive electrode 110 for moving the magnetic material 102 is provided on the substrate on both sides of the magnetic material 102. The magnetic material 102 is turned by the electrostatic force, which is generated due to a potential difference between the magnetic material 102 and the drive electrodes 110, in two rotational directions.

In the electromechanical filter 100, the electromechanical filter 100a, and the electromechanical filter 400 in the embodiment 1 and the embodiment 2, the DC bias magnetic field H is fixed and the movable electrode 101 is moved. In contrast, in the electromechanical filter 500 in the embodiment 3, the DC bias magnetic field H is movable and the movable electrode 101 is provided as the fixed electrode 111. In either case, the movable electrode is formed to create a bridge. But the fixed electrode 111 can have a large thickness of a beam to avoid a variation and can improve durability and reliability. In this manner, the profile of the DC bias magnetic field H and the relative position of the fixed electrode 111 as the signal line positioned in such magnetic field, that the configurations of the electromechanical filter 100, the electromechanical filter 100a, and the electromechanical filter 400 in the embodiment 1 and the embodiment 2 and the method of manufacturing the same are difficult to realize, can be realized by changing the configuration.

Also, in the embodiment 3, the fixed electrode is formed like a bridge. But the fixed electrode may be formed by the conductor pattern formed on the surface of the substrate, then the stem 109 made of the insulating material may be formed thereon, and then the magnetic material pattern that is moved around the stem 109 as a fulcrum may be formed in the same way as shown in FIGS. 10(a) and (b).

Further, in case at least an outer wall of the stem 109 is made of the insulating material, the fixed electrode can be formed on the stem 109 in a self-alignment manner with the stem 109. Therefore, the number of times of the photolithography steps can be reduced, the drive electrode (fixed electrode) can be arranged in close vicinity to the magnetic material pattern, and thus an enhancement of the electrostatic force as well as a reduction in an occupied area can be achieved.

Next, the tunable filtering mechanism in the electromechanical filter 500 in the embodiment 3 of the present invention will be explained hereunder.

FIG. 10(b) is a sectional view showing the configuration of the electromechanical filter in the embodiment 3 of the present invention. FIG. 10(b) is a longitudinal sectional view showing the configuration of the electromechanical filter using the carbon nanotube. The signal being input from the signal input port IN propagates through the fixed electrode 111, and is output to the signal output port OUT. In this case, since the movable electrode is positioned in the DC bias magnetic field H that the magnetic material 102 generates, the signal filtering due to the ferromagnetic resonance phenomenon occurs. Thus, only the signal of the particular frequency that is decided by the ferromagnetic resonance frequency can propagate to the signal output port OUT.

In addition to this signal filtering function, a tunable function is added to the electromechanical filter of the present invention. The ferromagnetic resonance frequency $f_r$ must be varied to make the frequency of the signal that can pass through the filter tunable. For that purpose, the DC bias magnetic field H in Eq.(1) expressing the ferromagnetic resonance frequency $f_r$ should be set variable.

As shown in FIG. 10(b), the DC bias magnetic field H is generated radially from the magnetic material 102. In the electromechanical filter of the present invention, since the magnetic material 102 is movable, relative positions of the DC bias magnetic field H and the fixed electrode 111 as the signal line can be varied. The moving direction of the magnetic material 102 is indicated by V2.

Figure 11:
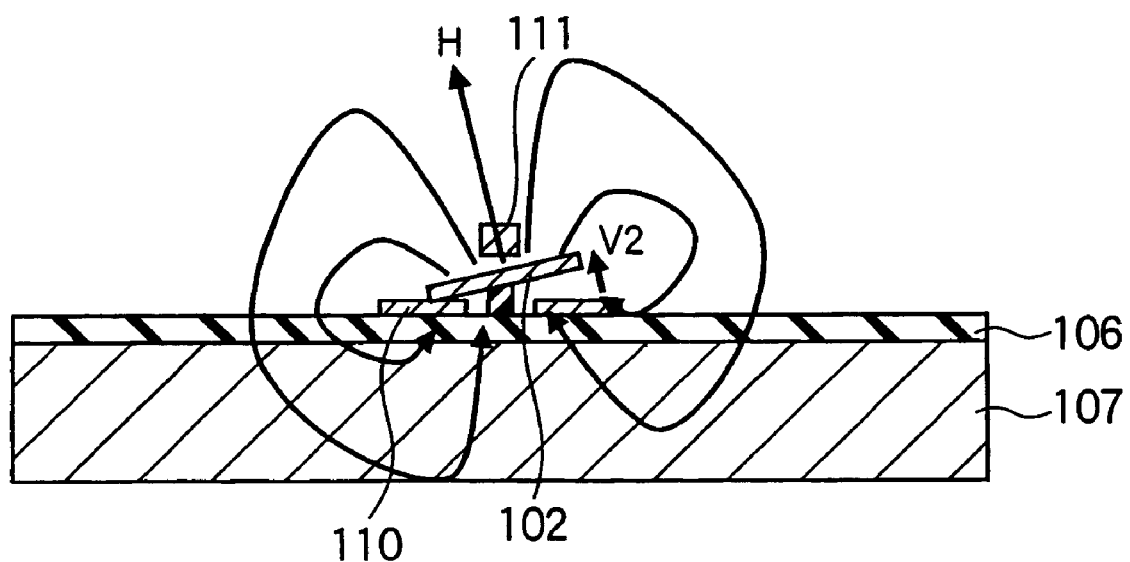
[FIG. 11] A view showing relative positions of the DC bias magnetic field and a fixed electrode when the magnetic material is moved.

FIG. 11 is a view showing relative positions of the DC bias magnetic field H and the fixed electrode 111 when the magnetic material 102 is moved. It can be seen that the vector (the direction and the intensity) of the DC bias magnetic field H passing through the fixed electrode 111 is changed.

According to such mechanism, the direction and the intensity of the DC bias magnetic field H passing through the fixed electrode can be varied and also the ferromagnetic resonance frequency can be changed.

In this case, the center frequency of this filtering characteristic and the tunable range depend on the intensity and the direction of the DC bias magnetic field H in the displacement range of the movable electrode 101. Therefore, the axis of easy magnetization decided by the deposition conditions of the magnetic material 102 and the magnetization direction decided by the external magnetic field applied after the magnetic material 102 is deposited must be directed from the magnetic material 102 to the fixed electrode 111. Also, since the fixed electrode 111 moves in the desired DC bias magnetic field H, relative positions such as a distance between the fixed electrode 111 and the magnetic material 102, heights, etc., and shapes such as a thickness, a width, etc. of the magnetic material 102 used to generate the desired DC bias magnetic field H must be optimized in response to the required tunable filter characteristic.

In this manner, according to the electromechanical filter 500, only the signal having a predetermined frequency can be selected and output, and the predetermined frequency can be tuned.

In this case, a multistage filter configuration in which the electromechanical filters of the present invention are connected in parallel or in series may be constructed.

Also, in the present embodiment, as the magnetic field generating portion, the coil may be formed in place of the magnetic material 102 to generate the similar DC bias magnetic field H. Also, the variable DC bias magnetic field H or the AC bias magnetic field may be generated by using the variable inductor constructed by the MEMS technology.

Also, in the embodiment 3, two drive electrodes 110 are provided and the magnetic material 102 can be turned in two rotational directions. Either of two drive electrodes 110 may be employed, and either of two directions may be employed as the moving direction V2 of the magnetic material 102.

Also, in the embodiment 3, two drive electrodes 110 are provided and the magnetic material 102 can be turned in two rotational directions. A plurality of drive electrodes 110 may be employed, and the moving direction V2 of the magnetic material 102 may be set in plural directions.

Embodiment 4

Figure 12:
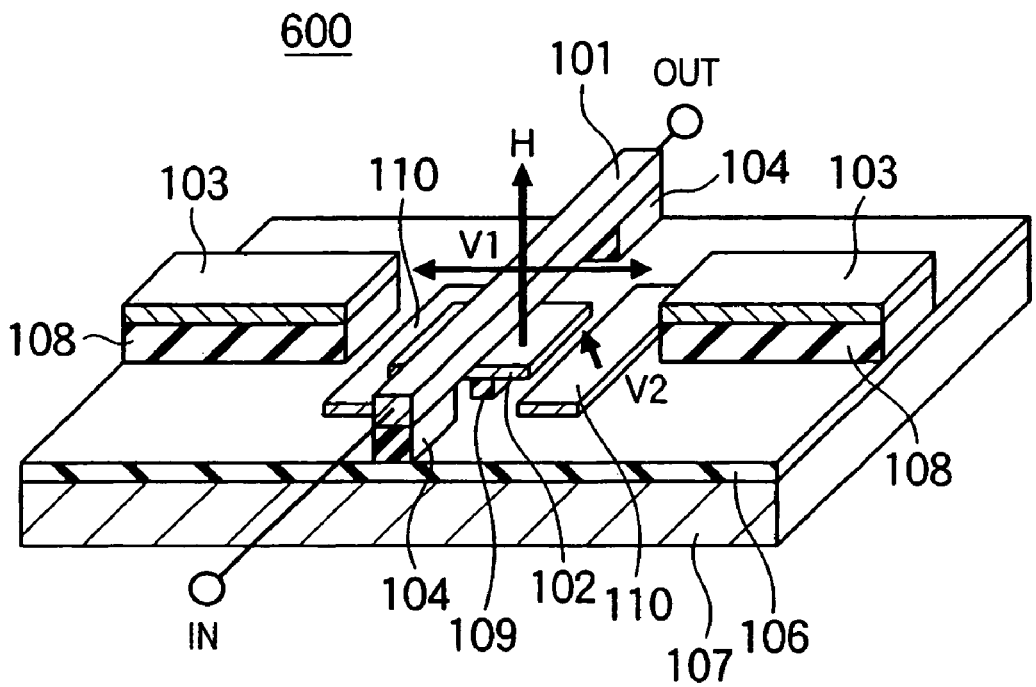
[FIG. 12] (a) is a perspective view showing a configuration of an electromechanical filter in an embodiment 4 of the present invention, and (b) is a sectional view showing the configuration of the electromechanical filter in the embodiment 4 of the present invention.
Figure 12:
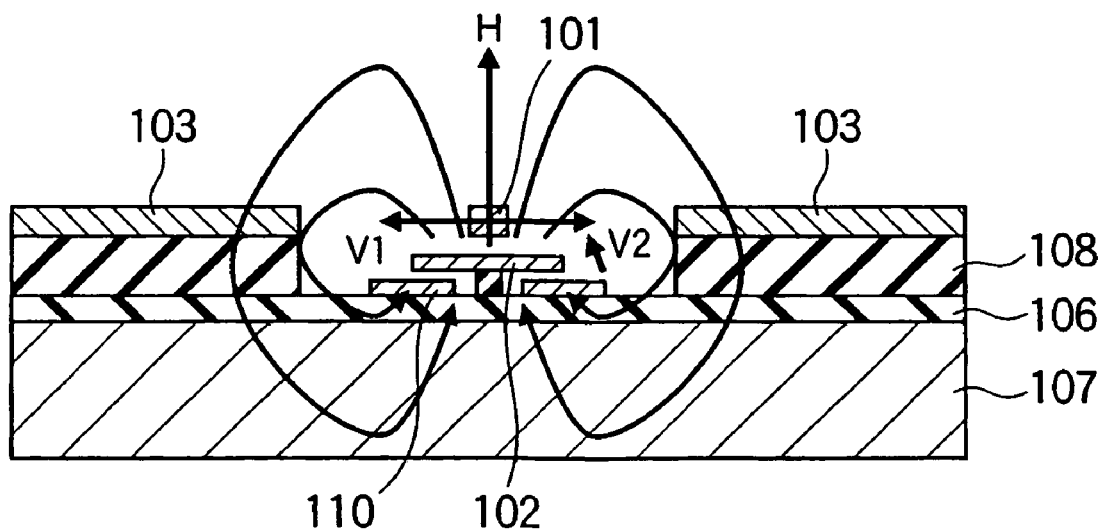

FIGS. 12 (a) and (b) are a perspective view and a sectional view showing a configuration of an electromechanical filter in an embodiment 4 of the present invention respectively.

In an electromechanical filter 600 shown in FIG. 12(a), the drive electrode 110 for driving further the magnetic material 102 by the electrostatic force in two horizontal directions is added to the configuration in the embodiment 3 such that the magnetic material 102 can be displaced in two rotational directions and two horizontal directions, so that the tuning can be controlled with high precision at a high degree of freedom.

That is, the movable electrode 101 bridged over the space between the posts 104, the signal input port IN for inputting the signal into the movable electrode 101, and the signal output port OUT for outputting the signal from the movable electrode 101 to the outside are provided on the substrate 107 on the surface of which the insulating film 106 is formed.

The magnetic material 102 for applying the DC bias magnetic field H to the movable electrode 101 is provided below the movable electrode 101. The magnetic material 102 is provided on the stem 109. The drive electrode 110 for moving the magnetic material 102 is provided on the substrate on both sides of the magnetic material 102. The magnetic material 102 is turned by the electrostatic force, which is generated due to a potential difference between the magnetic material 102 and the drive electrodes 110, in two rotational directions.

Meanwhile, the drive electrodes 103 are provided on both sides of the movable electrode 101 to put the movable electrode 101 between them. Thus, the movable electrode 101 can be moved in two horizontal directions by the electrostatic force that is generated by a potential difference between the movable electrode 101 and the drive electrodes 103. Since the drive electrodes 103 must provide the desired driving force to the movable electrode 101, they are provided on the substrate 107 via the spacer 108 respectively in such a manner that they are provided in positions that are optimized relatively to the movable electrode 101.

In this manner, in the electromechanical filter 100, the electromechanical filter 100a, the electromechanical filter 400, and the electromechanical filter 500 in the embodiment 1, the embodiment 2, and the embodiment 3, either the DC bias magnetic field H or the movable electrode 101 and the fixed electrode 111 as the signal line can be moved. In contrast, in the electromechanical filter 600 in the embodiment 4, both the DC bias magnetic field H and the movable electrode 101 can be moved. In this manner, the profile of the DC bias magnetic field H and the relative positions of the movable electrode 101 as the signal line positioned in such magnetic field and the magnetic material 102, that the configurations of the electromechanical filter 100, the electromechanical filter 100a, the electromechanical filter 400, and the electromechanical filter 500 in the embodiment 1, the embodiment 2, and the embodiment 3 and the method of manufacturing the same are difficult to realize, can be realized by changing the configuration.

Next, the tunable filtering mechanism in the electromechanical filter 600 will be explained hereunder.

FIG. 12(b) is a sectional view showing the configuration of the electromechanical filter in the embodiment 4 of the present invention. FIG. 12(b) is a longitudinal sectional view showing the configuration of the electromechanical filter using the carbon nanotube. The signal being input from the signal input port IN propagates through the movable electrode 101, and is output to the signal output port OUT. In this case, since the movable electrode is positioned in the DC bias magnetic field H that the magnetic material 102 generates, the signal filtering due to the ferromagnetic resonance phenomenon occurs. Thus, the signal of a particular frequency is absorbed by the ferromagnetic resonance frequency, and only the signal of the remaining particular frequency can propagate to the signal output port OUT.

In addition to this signal filtering function, the tunable function is added to the electromechanical filter of the present invention. The ferromagnetic resonance frequency $f_r$ must be varied to make the frequency of the signal that can pass through the filter tunable. For that purpose, the DC bias magnetic field H in Eq. (1) expressing the ferromagnetic resonance frequency $f_r$ should be set variable.

As shown in FIG. 12(b), the DC bias magnetic field H is generated radially from the magnetic material 102. In the electromechanical filter of the present invention, since the magnetic material 102 is movable, relative positions of the DC bias magnetic field H and the movable electrode 101 as the signal line can be varied. The moving direction of the magnetic material 102 is indicated by V2.

Also, in the electromechanical filter of the present invention, the movable electrode 101 as the signal line can be moved simultaneously in the DC bias magnetic field H. The moving direction of the movable electrode 101 is indicated by V1.

Figure 13:
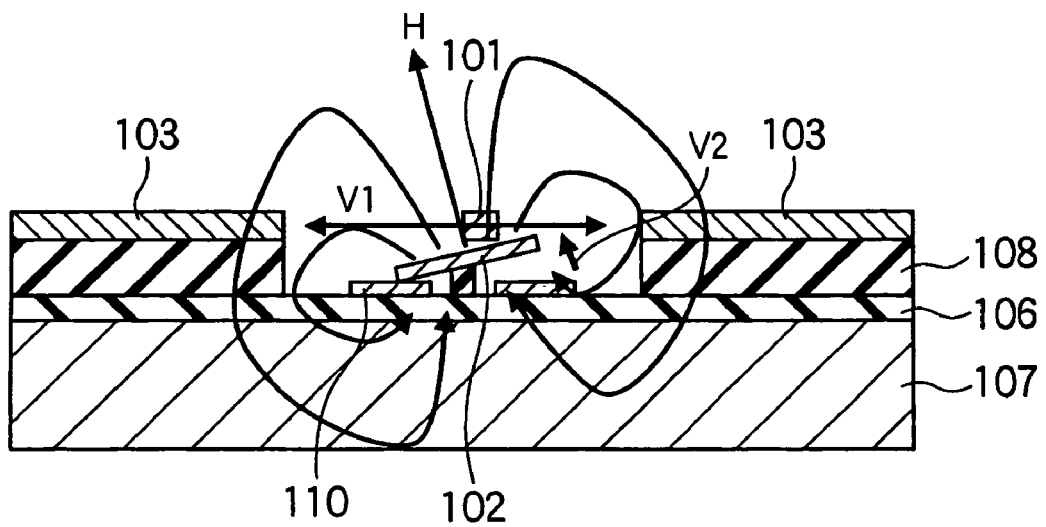
[FIG. 13] A view showing relative positions of the DC bias magnetic field and the movable electrode when the magnetic material and the movable electrode are moved.

FIG. 13 is a view showing relative positions of the DC bias magnetic field H and the movable electrode 101 when the magnetic material 102 and the movable electrode 101 are moved. It is understood from a comparison between FIG. 13 and FIG. 12(b) that the vector and the intensity of the DC bias magnetic field H passing through the movable electrode 101 are varied.

According to such mechanism, the vector and the intensity of the DC bias magnetic field passing through the fixed electrode can be varied, so that the ferromagnetic resonance frequency can be changed.

In this case, since the center frequency of the filter characteristic and the tunable range depend on the intensity and the vector of the DC bias magnetic field H in the displacement range of the movable electrode 101 and the magnetic material 102, the axis of easy magnetization decided by the depositing conditions of the magnetic material 102 and the magnetizing direction decided by the external magnetic field applied after the deposition of the magnetic material 102 must be set along the direction from the magnetic material 102 to the movable electrode 101. Also, since the movable electrode 101 is moved in the desired DC bias magnetic field H, relative positions such as a distance between the movable electrode 101 and the magnetic material 102, respective heights, etc., and shapes such as a thickness, a width, etc. of the magnetic material 102 to generate the desired DC bias magnetic field H must be optimized in response to the required tunable filter characteristic.

In this manner, according to the electromechanical filter 600, only the signal of the predetermined frequency can be selected and output, and the predetermined frequency can be tuned.

Also, the multistage filter configuration in which the electromechanical filters of the present invention are connected in parallel or in series may be employed.

Also, as the magnetic field generating portion, the coil may be formed in place of the magnetic material 102 to generate the similar DC bias magnetic field H. Also, the variable DC bias magnetic field H or the AC bias magnetic field may be generated by using the variable inductor constructed by the MEMS technology.

Also, in the embodiment 4, two drive electrodes 110 are provided and the magnetic material 102 can be turned in two rotational directions. Either of two drive electrodes 110 may be employed, and either of two directions may be employed as the moving direction V2 of the magnetic material 102.

Also, in the embodiment 4, two drive electrodes 103 are provided and the movable electrode 101 can be moved in two horizontal directions. Either of two drive electrodes 103 may be employed, and either of two directions may be employed as the moving direction V1 of the movable electrode 101.

Also, in the embodiment 4, two drive electrodes 110 are provided and the magnetic material 102 can be turned in two rotational directions. A plurality of drive electrodes 110 may be employed, and the moving direction V2 of the magnetic material may be set in plural directions.

Also, in the embodiment 4, two drive electrodes 103 are provided and the movable electrode 101 can be moved in two horizontal directions. A plurality of drive electrodes 103 maybe provided, and then the moving direction V1 of the movable electrode 101 may be set in plural directions.

Embodiment 5

Figure 14:
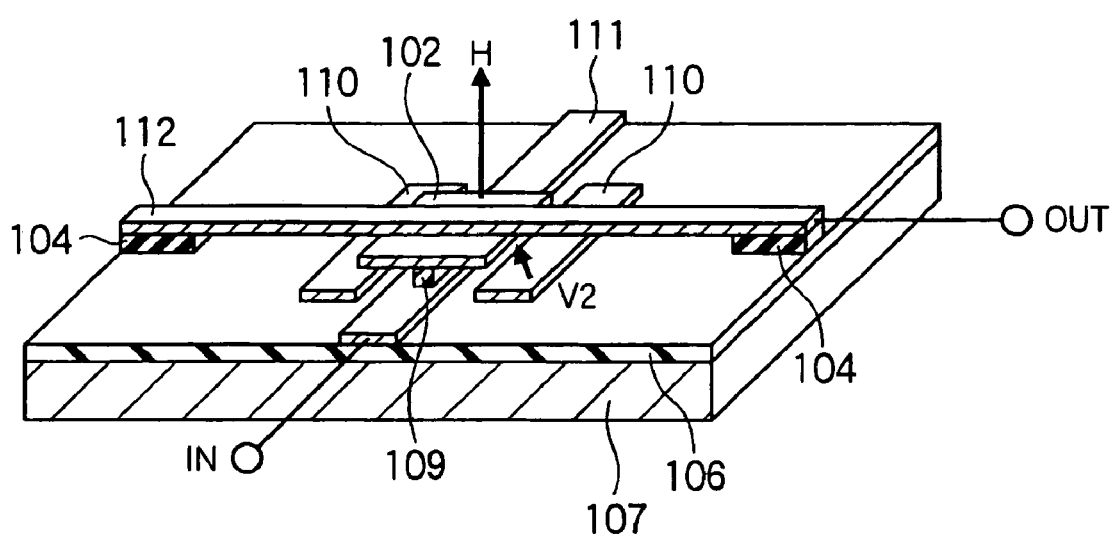
[FIG. 14] A perspective view showing a configuration of an electromechanical filter in an embodiment 5 of the present invention.

FIG. 14 is a perspective view showing a configuration of an electromechanical filter in an embodiment 5 of the present invention.

In the above embodiments, the filters in which the signal of the particular frequency out of the signals that propagate through one signal line is stopped by the ferromagnetic resonance and remaining signals are output are explained. In contrast, in the present embodiment, the tuning of the signal can be realized by an induced electromotive force of the input signal.

More particularly, the high-frequency magnetic field is generated around the fixed electrode 111 as the signal line by the high-frequency current to excite a precession of the spin excited in the magnetic material 102 by the high-frequency magnetic field, then a fixed electrode 112 as the output signal line is arranged in the area in which such electrode can receive the magnetic field of the signal line and the magnetic field generated by the precession of the spin of the magnetic material 102 by utilizing such a phenomenon that an angle of the precession in the magnetic material 102 is maximized by the ferromagnetic resonance phenomenon, and then the signal can propagate to the signal output port OUT only when the induced electromotive force produced by this resonance exceeds a predetermined magnitude, whereby a band-stop filter can be constructed.

In an electromechanical filter 700 shown in FIG. 14, the fixed electrode 111 and the signal input port IN for inputting the signal are provided on the substrate 107 on the surface of which the insulating film 106 is formed. The magnetic material 102 is provided over the fixed electrode 111, and the magnetic material 102 is provided on the stem 109. The drive electrodes 110 for causing the magnetic material 102 to displace are provided on the substrate on both sides of the magnetic material 102. The magnetic material 102 is turned by the electrostatic force, which is generated by a potential difference between the magnetic material 102 and the drive electrodes 110, in two rotational directions. The fixed electrode 112 bridged over a space between the posts 104 and the signal output port OUT for outputting the signal from the fixed electrode 112 to the outside are provided over the magnetic material 102. The fixed electrodes 111, 112 are constructed to put the magnetic material 102 between them, and the fixed electrode 112 is arranged to intersect orthogonally with the fixed electrode 111.

Next, the tunable filtering mechanism in the electromechanical filter 700 will be explained hereunder.

The signal being input from the signal input port N propagates through the fixed electrode 111 to generate the high-frequency magnetic field around the fixed electrode 111 by the high-frequency current. The precession of the spin is excited in the magnetic material 102 by the high-frequency magnetic field (kittel mode). The ferromagnetic resonance phenomenon occurs only when the signal of the ferromagnetic resonance frequency of the magnetic material 102 is input, so that the angle of the precession in the magnetic material 102 is maximized and also a magnitude of the induced electromotive force is maximized. As a result, the signal filtering is caused, and thus only the signal of the particular frequency decided by the ferromagnetic resonance frequency can propagate to the signal output port OUT.

In addition to this signal filtering function, the tunable function is added to the electromechanical filter of the present invention. The ferromagnetic resonance frequency $f_r$ must be varied to tune the frequency of the signal that can pass through the filter. For that purpose, the DC bias magnetic field H in Eq. (1) giving the ferromagnetic resonance frequency $f_r$ should be varied.

The DC bias magnetic field H is generated radially from the magnetic material 102. In the electromechanical filter of the present invention, since the magnetic material 102 is movable, relative positions of the DC bias magnetic field H and the fixed electrode 111 as the signal line can be varied. The moving direction of the magnetic material 102 is indicated by V2.

According to such mechanism, the vector and the intensity of the DC bias magnetic field passing through the fixed electrode can be varied, so that the ferromagnetic resonance frequency can be changed.

In this case, since the center frequency of the filter characteristic and the tunable range depend on the intensity and the direction of the DC bias magnetic field H in the displacement range of the magnetic material 102, the axis of easy magnetization decided by the depositing conditions of the magnetic material 102 and the magnetizing direction decided by the external magnetic field applied after the deposition of the magnetic material 102 must be set along the direction from the magnetic material 102 to the fixed electrode 111. Also, since the fixed electrode 111 is moved in the desired DC bias magnetic field H, relative positions such as a distance between the fixed electrode 111 and the magnetic material 102, respective heights, etc., and shapes such as a thickness, a width, etc. of the magnetic material 102 to generate the desired DC bias magnetic field H must be optimized in response to the required tunable filter characteristic.

In this manner, according to the electromechanical filter 700 of the present embodiment, only the signal of the predetermined frequency can be selected and output, and the predetermined frequency can be tuned.

In the present embodiment, the turning of the magnetic material 102 in the axial direction is realized. But the stem may be shaped into a fine pole formed perpendicular to the substrate surface, and then the magnetic material 102 may be formed to rotate in all directions using the pole as a fulcrum.

In this case, it is desired that the magnetic material 102 should be formed as a circular pattern around the pole.

Further, a plurality of fixed electrodes may be arranged around the pole as the drive electrode, and then the turning of the magnetic material 102 may be controlled by controlling potentials of respective fixed electrodes.

Also, in the electromechanical filter 700, in order to prevent that the induced electromotive force is generated in the fixed electrode 112 directly by the magnetic field generated by the signal that is input into the fixed electrode 111, the fixed electrode 111 and the fixed electrode 112 are arranged so as to intersect orthogonally with each other. But the electromechanical filter in which the fixed electrode 111 and the fixed electrode 112 are arranged in parallel at a distance not to establish a correlation between them can be manufactured.

Figure 15:
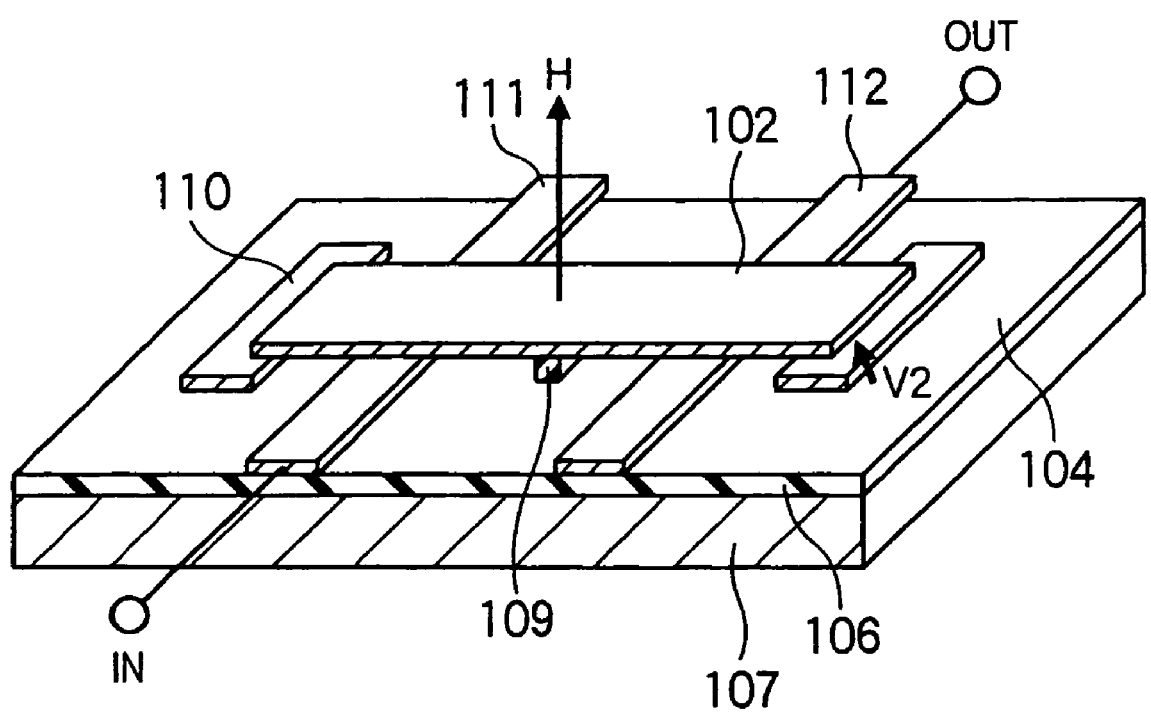
[FIG. 15] A perspective view showing a configuration of a variation of the electromechanical filter in the embodiment 5 of the present invention.

FIG. 15 is a perspective view showing a configuration of a variation of the electromechanical filter in the embodiment 5 of the present invention.

In an electromechanical filter 800 shown in FIG. 15, the fixed electrode 111 and the signal input port IN for inputting the signal are provided on the substrate 107 on the surface of which the insulating film 106 is formed. The magnetic material 102 is provided over the fixed electrode 111, and the magnetic material 102 is provided on the stem 109 made of silicon, or the like. The drive electrodes 110 for causing the magnetic material 102 to move are provided on the substrate on both sides of the magnetic material 102. The magnetic material 102 is turned by the electrostatic force, which is generated by a potential difference between the magnetic material 102 and the drive electrodes 110, in two rotational directions. The fixed electrode 112 is arranged below the magnetic material 102 in parallel with the fixed electrode 111 at an interval that is enough to prevent the influence of the magnetic field generated by the fixed electrode 111. The signal output port OUT for outputting the signal to the outside is provided to the fixed electrode 112.

Next, the tunable filtering mechanism in the electromechanical filter 800 will be explained hereunder.

The signal being input from the signal input port IN propagates through the fixed electrode 111 to generate the high-frequency magnetic field around the fixed electrode 111 by the high-frequency current. The precession of the spin is excited in the magnetic material 102 by the high-frequency magnetic field (kittel mode). Then, the spin wave travels from the fixed electrode 111 side to the fixed electrode 112 side, and the induced electromotive force is generated in the fixed electrode 112 by the magnetic field generated by this mode on the fixed electrode 112 side. The ferromagnetic resonance phenomenon occurs only when the signal of the ferromagnetic resonance frequency of the magnetic material 102 is input, so that the angle of the precession in the magnetic material 102 is maximized and also a magnitude of the induced electromotive force is maximized. As a result, the signal filtering is caused, and thus only the signal of the particular frequency decided by the ferromagnetic resonance frequency can propagate to the signal output port OUT.

In addition to this signal filtering function, the tunable function is added to the electromechanical filter of the present invention. The ferromagnetic resonance frequency $f_r$ must be varied to tune the frequency of the signal that can pass through the filter. For that purpose, the DC bias magnetic field H in Eq. (1) giving the ferromagnetic resonance frequency $f_r$ should be varied.

The DC bias magnetic field H is generated radially from the magnetic material 102. In the electromechanical filter of the present invention, since the magnetic material 102 is movable, relative positions of the DC bias magnetic field H and the fixed electrode 111 as the signal line can be varied. The moving direction of the magnetic material 102 is indicated by V2.

According to such mechanism, the vector and the intensity of the DC bias magnetic field passing through the fixed electrode can be varied, so that the ferromagnetic resonance frequency can be changed.

In this case, since the center frequency of the filter characteristic and the tunable range depend on the intensity and the vector of the DC bias magnetic field H in the displacement range of the magnetic material 102, the axis of easy magnetization decided by the depositing conditions of the magnetic material 102 and the magnetizing direction decided by the external magnetic field applied after the deposition of the magnetic material 102 must be set along the direction from the magnetic material 102 to the fixed electrode 111. Also, since the fixed electrode 111 is moved in the desired DC bias magnetic field H, relative positions such as a distance between the fixed electrode 111 and the magnetic material 102, respective heights, etc., and shapes such as a thickness, a width, etc. of the magnetic material 102 to generate the desired DC bias magnetic field H must be optimized in response to the required tunable filter characteristic.

In this manner, according to the electromechanical filter 800, only the signal of the predetermined frequency can be selected and output, and the predetermined frequency can be tuned.

Also, a multistage filter configuration in which the electromechanical filters of the present invention are connected in parallel or in series may be employed.

Also, as the magnetic field generating portion, the coil may be formed in place of the magnetic material 102 to generate the similar DC bias magnetic field H. Also, the variable DC bias magnetic field H or the AC bias magnetic field may be generated by using a variable inductor constructed by the MEMS technology.

Also, in the embodiment 5, two drive electrodes 110 are provided and the magnetic material 102 can be turned in two rotational directions. Either of two drive electrodes 110 may be employed, and either of two directions may be employed as the moving direction V2 of the magnetic material 102.

Also, in the embodiment 5, two drive electrodes 110 are provided and the magnetic material 102 can be turned in two rotational directions. A plurality of drive electrodes 110 may be employed, and the moving direction V2 of the magnetic material may be set in plural directions.

As described above, the electromechanical filter of the present invention can provide a tunable electromechanical filter that is small in size and has a small consumption power. It is needless to say that such electromechanical filter is useful for the discrete element. Also, such electromechanical filter can be integrated together with other circuit elements. At that time, a semiconductor integrated circuit device including the small-size filter having a small transmission loss and a high reliability can be provided.

Also, in the above embodiments, the examples in which the movable electrode is formed by forming the beam on the surface of the substrate are explained. In either example, a trench having a desired sectional shape is formed on the substrate and then the beam is left in the trench as the movable portion. Such configuration can be realized easily by the anisotropic etching of silicon, or the like.

Further, in the above embodiments, the electrode material or the magnetic film material that is suitable for the used substrate such as the compound semiconductor substrate made of GaAs, or the like as well as the silicon substrate may be selected. The integration of such electromechanical filter together with other circuit elements can be extremely facilitated. Also, as the insulating film 106 for covering the surface of the substrate and the insulating film used as the spacer, a silicon oxide film, a silicon nitride film, or a laminated film may be employed.

Also, the carbon nanotube can be applied to respective embodiments.

INDUSTRIAL APPLICABILITY

The electromechanical filter according to the present invention can vary the direction and the intensity of the DC bias magnetic field passing through the electrode by constructing the magnetic material or the electrode as the signal line movably, and is useful for the electromechanical filter having a tunable function attained by varying a ferromagnetic resonance frequency.

The invention claimed is:
1. An electromechanical filter comprising:
  a conductor acting as a signal line;
  a magnetic field generating portion which generates a magnetic field passing through the conductor; and
  a drive electrode which changes the magnetic field passing through the signal line by displacing relative positions of the conductor and the magnetic field generating portion.
2. The electromechanical filter according to claim 1, wherein the conductor is an electrode that is arranged to oppose to the drive electrode and is displaced by an electrostatic force generated between the drive electrode and the conductor.

3. The electromechanical filter according to claim 2, further comprising:
a drive electrode formed on a substrate surface and constructed to vary a potential;
a conductor pattern arranged on the drive electrode to oppose thereto at a predetermined interval to constitute the signal line; and
a magnetic field generating portion comprising a magnetic material film pattern that is magnetized to have a magnetic filed component that intersects orthogonally with the signal line,
wherein the signal line is displaced by changing a potential of the drive electrode, and a ferromagnetic resonance frequency is changed by changing the magnetic field generated by the magnetic material film pattern on the signal line.

4. The electromechanical filter according to claim 3,
wherein the magnetic material film pattern is formed on an insulating film that covers a semiconductor substrate surface, and
wherein the signal line constitutes a fixed beam that is arranged to oppose to the magnetic material film pattern.

5. The electromechanical filter according to claim 3,
wherein the signal line is arranged in parallel with the drive electrode, and
wherein the magnetic material film pattern generates a magnetic field in a direction that intersects orthogonally with the signal passing through the conductor pattern.

6. The electromechanical filter according to any one of claims 3,
wherein the drive electrode includes first and second conductor film patterns arranged to put the signal line therebetween.

7. The electromechanical filter according to claim 2, further comprising:
a magnetic field generating portion formed of a magnetic material film pattern formed on a substrate surface;
a conductor pattern arranged movably on the magnetic material film pattern to oppose thereto at a predetermined interval to constitute the signal line; and
a drive electrode arranged in close vicinity to the signal line,
wherein the magnetic material film pattern is magnetized to have a magnetic field component that intersects orthogonally with the signal line, and
wherein the signal line is displaced by changing a potential of the drive electrode, and a ferromagnetic resonance frequency is changed by changing the magnetic field generated by the magnetic material film pattern on the signal line.

8. The electromechanical filter according to claim 7,
wherein the magnetic material film pattern is formed on an insulating film that covers a semiconductor substrate surface, and
wherein the signal line constitutes a fixed beam that is arranged to oppose to the magnetic material film pattern.

9. The electromechanical filter according to claim 7,
wherein the signal line is arranged in parallel with the drive electrode, and
wherein the magnetic material film pattern generates a magnetic field in a direction that intersects orthogonally with the signal passing through the conductor pattern.

10. The electromechanical filter according to claim 7,
wherein the drive electrode includes first and second conductor film patterns arranged to put the signal line therebetween.

11. The electromechanical filter according to claim 1,
wherein the magnetic field generating portion includes a magnetic material that is formed to be displaced.

12. The electromechanical filter according to claim 11,
wherein the magnetic material that is displaced by an electrostatic force of the drive electrode.

13. The electromechanical filter according to claim 12, further comprising:
a magnetic field generating portion formed of a magnetic material film pattern that is formed on a substrate surface movably in a space;
a conductor pattern fixed/arranged onto the substrate to oppose to the magnetic material film pattern at a predetermined interval and to constitute the signal line; and
a drive electrode arranged in close vicinity to the magnetic field generating portion to displace the magnetic field generating portion,
wherein the magnetic material film pattern is magnetized to have a magnetic field component that intersects orthogonally with the signal line, wherein the signal line is displaced by changing a potential of the drive electrode, and
wherein a ferromagnetic resonance frequency is changed by changing the magnetic field generated by the magnetic material film pattern on the signal line.

14. The electromechanical filter according to claim 13,
wherein the magnetic material film pattern constitutes a beam member that is formed via a spacer formed on a semiconductor substrate surface.

15. The electromechanical filter according to claim 14,
wherein the signal line is a conductor pattern that is formed on a semiconductor substrate surface via an insulating film.

16. The electromechanical filter according to claim 15,
wherein the signal line is formed over the magnetic material film pattern to oppose thereto at a predetermined interval.

17. The electromechanical filter according to claim 1,
wherein the drive electrode is movable.

18. The electromechanical filter according to claim 17, further comprising:
a magnetic field generating portion formed of a magnetic material film pattern that is formed on a substrate surface movably in a space;
a conductor pattern fixed/arranged onto the substrate to oppose to the magnetic material film pattern at a predetermined interval and to constitute the signal line; and
a drive electrode arranged in close vicinity to the magnetic field generating portion to displace the magnetic field generating portion,
wherein the magnetic material film pattern is magnetized to have a magnetic field component that intersects orthogonally with the signal line,
wherein the signal line is displaced by changing a potential of the drive electrode, and
wherein a ferromagnetic resonance frequency is changed by changing the magnetic field generated by the magnetic material film pattern on the signal line.

19. The electromechanical filter according to claim 18,
wherein the magnetic material film pattern constitutes a beam member that is formed via a spacer formed on a semiconductor substrate surface.

20. The electromechanical filter according to claim 19, wherein the signal line is a conductor pattern that is formed on a semiconductor substrate surface via an insulating film.

21. The electromechanical filter according to claim 20, wherein the signal line is formed over the magnetic material film pattern to oppose thereto at a predetermined interval.

22. The electromechanical filter according to claim 1, further comprising:

first and second drive electrodes formed on a substrate surface and constructed to vary a potential;

a conductor pattern arranged to oppose to the first drive electrode at a predetermined interval and to constitute the signal line; and a magnetic field generating portion comprising a magnetic material film pattern that is magnetized to have a magnetic field component that intersects orthogonally with the signal line, wherein the signal line is displaced by changing a potential of the first drive electrode, wherein the magnetic material film pattern is displaced by changing a potential of the second drive electrode, and wherein a ferromagnetic resonance frequency is changed by changing the magnetic field generated by the magnetic material film pattern on the signal line.

23. The electromechanical filter according to claim 1, further comprising:

a first conductor acting as the signal line;

a magnetic field generating portion which generates the magnetic field passing through the first conductor;

a drive electrode which varies the magnetic field passing through the signal line by displacing relative positions of the first conductor and the magnetic field generating portion; and a second conductor acting as a signal line that transmits an induced electromotive force induced by a resonance between a magnetic field generated by a high-frequency current passing through the first conductor and the magnetic field generated by the magnetic field generating portion.

24. The electromechanical filter according to claim 23, wherein the first conductor and the second conductor are arranged to intersect orthogonally with each other.

25. The electromechanical filter according to claim 23, wherein the first conductor and the second conductor are arranged in parallel at a predetermined interval.

26. The electromechanical filter according to claim 1, wherein a plurality of the electromechanical filters are aligned and connected to realize a tunable band-pass filter function.

27. The electromechanical filter according to claim 1, wherein a plurality of the electromechanical filters are aligned and connected to realize a tunable band-stop filter function.

* * * * *